(12) United States Patent
Seo et al.

(10) Patent No.: US 11,075,259 B2
(45) Date of Patent: Jul. 27, 2021

(54) DISPLAY DEVICE HAVING REDUCED CELL SEAL AREA AND METHOD OF MANUFACTURING DISPLAY DEVICE

(71) Applicant: Samsung Display Co., Ltd., Yongin-si (KR)

(72) Inventors: Woo Suk Seo, Yongin-si (KR); Sang Woo Ha, Suwon-si (KR); Sung Chul Kim, Seongnam-si (KR); Jung Hyun Kim, Suwon-si (KR); Si Joon Song, Suwon-si (KR); Jun Ho Song, Seongnam-si (KR); Bong Hyun You, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/923,159

(22) Filed: Jul. 8, 2020

(65) Prior Publication Data

US 2020/0335574 A1   Oct. 22, 2020

Related U.S. Application Data

(62) Division of application No. 16/136,532, filed on Sep. 20, 2018, now Pat. No. 10,741,630.

(30) Foreign Application Priority Data

Nov. 15, 2017   (KR) .......................... 10-2017-0152075

(51) Int. Cl.
*H01L 27/32* (2006.01)
*H01L 51/52* (2006.01)
*H01L 51/56* (2006.01)
*B23K 26/06* (2014.01)

(52) U.S. Cl.
CPC .......... *H01L 27/3276* (2013.01); *B23K 26/06* (2013.01); *H01L 51/5203* (2013.01); *H01L 51/5246* (2013.01); *H01L 51/56* (2013.01)

(58) Field of Classification Search
CPC ............. H01L 27/3276; H01L 51/5246; H01L 51/5203; H01L 51/56; B23K 26/06
See application file for complete search history.

(56) References Cited

U.S. PATENT DOCUMENTS

| | | | | |
|---|---|---|---|---|
| 7,626,138 | B2 ‡ | 12/2009 | Bovatsek | ........... B23K 26/0617 219/12 |
| 9,214,643 | B2 ‡ | 12/2015 | Yamazaki | ................ H01L 51/52 |
| 2004/0206953 | A1 ‡ | 10/2004 | Morena et al. | ............ C03C 8/24 257/40 |
| 2005/0199599 | A1 ‡ | 9/2005 | Li et al. | .............. H01L 51/5246 219/12 |
| 2007/0051706 | A1 | 3/2007 | Bovatsek et al. | |

(Continued)

FOREIGN PATENT DOCUMENTS

| KR | 1020130094308 | ‡ | 8/2013 |
|---|---|---|---|
| KR | 1020180062497 | ‡ | 6/2018 |

*Primary Examiner* — Tracie Y Green
(74) *Attorney, Agent, or Firm* — Cantor Colburn LLP

(57) ABSTRACT

A display device includes: a first substrate in which a display area and a non-display area disposed outside the display area are defined; a second substrate facing the first substrate; and a cell seal disposed on the non-display area, where the cell seal includes a bonding filament connecting the first substrate and the second substrate to each other.

8 Claims, 23 Drawing Sheets

(56) References Cited

U.S. PATENT DOCUMENTS

| | | | |
|---|---|---|---|
| 2009/0167155 A1‡ | 7/2009 | Kwak | H01L 27/3276 313/504 |
| 2010/0117067 A1‡ | 5/2010 | Sin | H01L 51/5246 257/40 |
| 2012/0043880 A1‡ | 2/2012 | Lee | H01L 51/5246 313/504 |
| 2013/0049062 A1‡ | 2/2013 | Hatano | H01L 21/50 257/99 |
| 2013/0126938 A1‡ | 5/2013 | Eberhardt et al. | H01L 33/483 257/99 |
| 2013/0344302 A1‡ | 12/2013 | Hélie et al. | B29D 11/00 428/19 |
| 2014/0055028 A1‡ | 2/2014 | Yi | H05B 33/04 313/498 |
| 2014/0138647 A1‡ | 5/2014 | Moon et al. | H01L 51/5246 257/40 |
| 2015/0144907 A1‡ | 5/2015 | Lin et al. | H01L 51/5246 257/40 |
| 2016/0013441 A1‡ | 1/2016 | Hong | H01L 51/5246 257/40 |
| 2016/0056183 A1‡ | 2/2016 | Fan | H01L 27/1248 257/347 |

‡ imported from a related application

DISPLAY DEVICE HAVING REDUCED CELL SEAL AREA AND METHOD OF MANUFACTURING DISPLAY DEVICE

This application is a divisional of U.S. patent application Ser. No. 16/136,532, filed on Sep. 20, 2018, which claims priority to Korean Patent Application No. 10-2017-0152075, filed on Nov. 15, 2017, and all the benefits accruing therefrom under 35 U.S.C. 119, the content of which in its entirety is herein incorporated by reference.

BACKGROUND

1. Field

Embodiments of the invention relate to a display device and a method of manufacturing the display device.

2. Description of the Related Art

The importance of a display device has increased with the development of multimedia. Accordingly, various types of display device such as a liquid crystal display ("LCD") and an organic light emitting display ("OLED") have been developed.

The image display of a display device such as an LCD device and an OLED device is affected by the transmission of light. In particular, the transmittance of light may influence the display quality such as luminance of the display device. Thus, the constituent elements of the display device may at least partially include a transparent member, for example, a glass member.

As a method of forming a multi-stack junction by bonding a plurality of transparent members, a method of bonding transparent members using a sealant which is a liquid or paste-like adhesive and a method of bonding transparent members using glass frits or glass powder may be used. In the sealant bonding, a first glass member and a second glass member may be bonded with each other by applying a liquid or paste-like sealant material between the first glass member and the second glass member and curing the liquid or paste-like sealant material.

In the glass frit/glass powder bonding, a first glass member and a second glass member may be bonded with each other by applying a glass frit/glass powder material between the first glass member and the second glass member and melting and curing the glass frit/glass powder material.

SUMMARY

Embodiments of the invention relate to a display device in which an area occupied by a cell seal is reduced.

Embodiments of the invention relate to a method of manufacturing a display device having reduced occupied area by a cell seal.

According to an embodiment of the invention, a display device includes: a first substrate in which a display area and a non-display area disposed outside the display area are defined; a second substrate facing the first substrate; and a cell seal disposed in the non-display area, where the cell seal includes a bonding filament connecting the first substrate and the second substrate to each other.

In an embodiment, each of the first substrate and the second substrate may include glass, and the bonding filament may include a same material as the first substrate and the second substrate.

In an embodiment, the bonding filament may have a width in a range of about 100 micrometers ($\mu m$) to about 200 $\mu m$.

In an embodiment, the bonding filament may include a central portion and a peripheral portion surrounding the central portion.

In an embodiment, the central portion may have a width in a range of about 20 $\mu m$ to about 70 $\mu m$.

In an embodiment, a refractive index of the central portion and a refractive index of the peripheral portion may be different from each other.

In an embodiment, a width of a middle end of the bonding filament may be greater than a width of an upper end of the bonding filament and a width of a lower end of the bonding filament.

In an embodiment, the bonding filament may include an inner bonding filament and an outer bonding filament.

In an embodiment, the inner bonding filament and the outer bonding filament may partially overlap each other.

In an embodiment, a refractive index of an overlap area of the inner bonding filament and the outer bonding filament and a refractive index of the inner bonding filament may be different from each other.

In an embodiment, at least one of the inner bonding filament and the outer bonding filament may be inclined at a predetermined inclination angle with respect to a thickness direction of the first substrate.

In an embodiment, the inner bonding filament and the outer bonding filament may intersect each other.

In an embodiment, the bonding filament may include a first bonding filament extending in a direction parallel to an X-axis, a second bonding filament extending in a direction parallel to a Y-axis, and an intersection portion at which the first bonding filament and the second bonding filament intersect each other.

In an embodiment, a width of an intersection portion of the first bonding filament and the second bonding filament may be greater than a width of the first bonding filament and the width of the second bonding filament.

In an embodiment, one end of the first bonding filament may protrude from the intersection portion in a direction parallel to the X-axis, and one end of the second bonding filament may protrude from the intersection portion in a direction parallel to the Y-axis.

In an embodiment, the cell seal may further include a frit seal connected with the bonding filament.

In an embodiment, the display device may further include: a driving integrated circuit disposed in the non-display area; and a plurality of conductive lines connecting the driving integrated circuit and the display area, where the frit seal overlaps the conductive lines.

According to another embodiment of the invention, a method of manufacturing a display device includes: sealing an original panel including a cell including a first substrate and a second substrate facing each other; and forming a cell seal to seal the cell, where the forming the cell seal includes forming a bonding filament connecting the first substrate and the second substrate by radiating a laser.

In an embodiment, the laser may include a first sub laser radiated toward the first substrate from the second substrate, a first focal point of the first sub laser may be inside the first substrate, and a focus depth of the first sub laser may be in a range of about −100 $\mu m$ to about zero (0) $\mu m$.

In an embodiment, the laser may further include a second sub laser radiated toward the second substrate from the first substrate, a second focal point of the second sub laser may be inside the second substrate, and a focus depth of the second sub laser may be in a range of about zero (0) μm to about 100 μm.

In an embodiment, at least one of the first sub laser and the second sub laser may be radiated at a predetermined inclination angle inclined with respect to a thickness direction of the first substrate.

In an embodiment, the method may further include: removing an insulation film disposed on the first substrate.

In an embodiment, the forming the bonding filament connecting the first substrate and the second substrate by radiating the laser may include: forming a first bonding filament by radiating the laser in a first direction; and forming a second bonding filament by radiating the laser in a second direction, where the first bonding filament and the second bonding filament intersect each other to form an intersection portion.

In an embodiment, the method may further include: forming a frit in the cell, wherein the forming the cell seal includes: curing the frit to form a frit seal, and the frit seal and the bonding filament may be connected to each other.

BRIEF DESCRIPTION OF THE DRAWINGS

The above and other features of the invention will become more apparent by describing in detail exemplary embodiments thereof with reference to the attached drawings, in which.

DETAILED DESCRIPTION OF THE EMBODIMENTS

Figure 1:
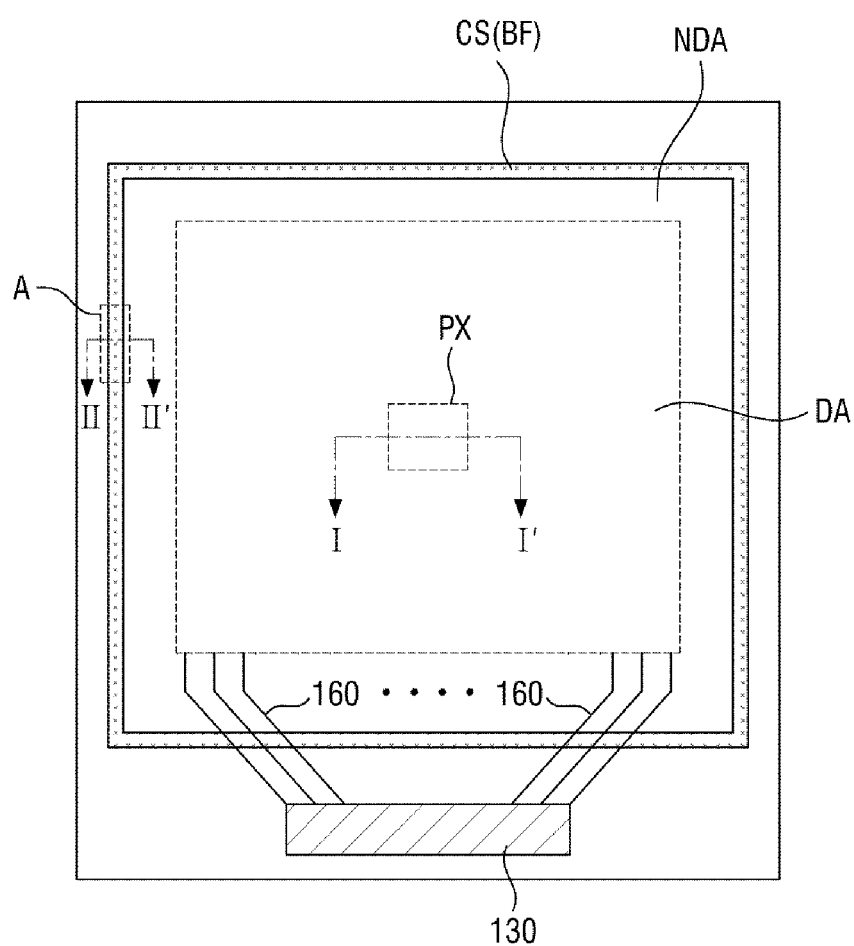
FIG. 1 is a schematic plan view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween. In the entire description of the invention, the same drawing reference numerals are used for the same elements across various figures.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the accompanying drawings.

Figure 2:
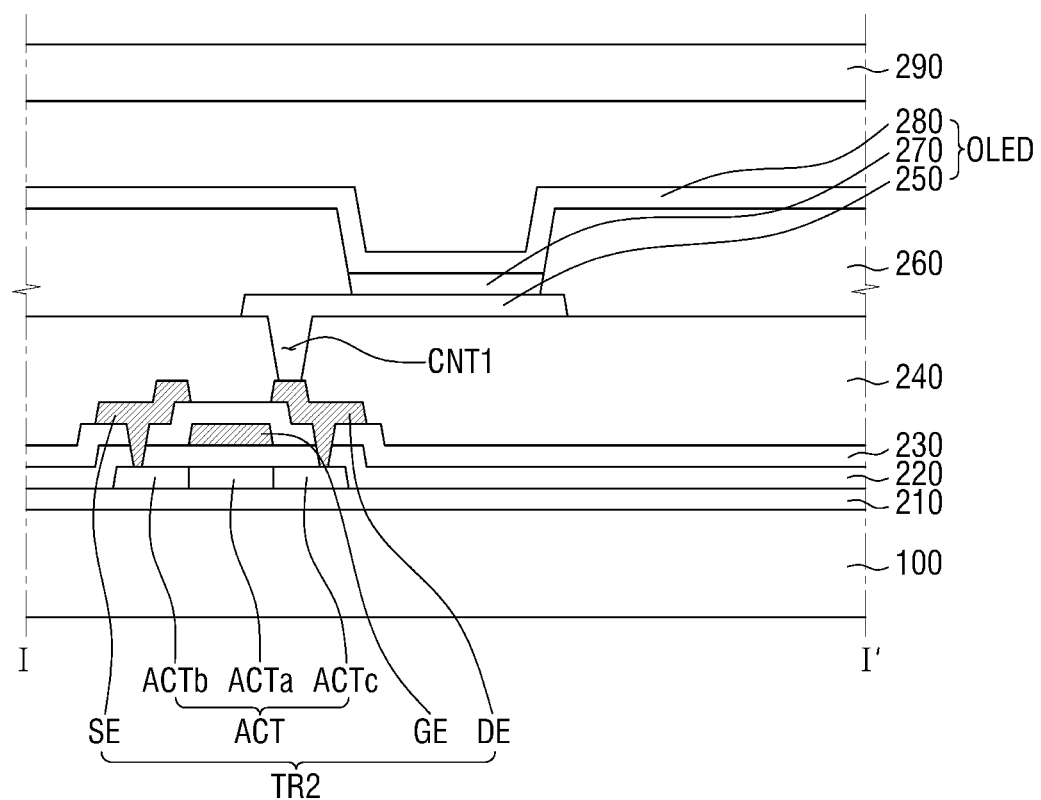
FIG. 2 is a cross-sectional view taken along line I-I' of FIG. 1.
Figure 3:
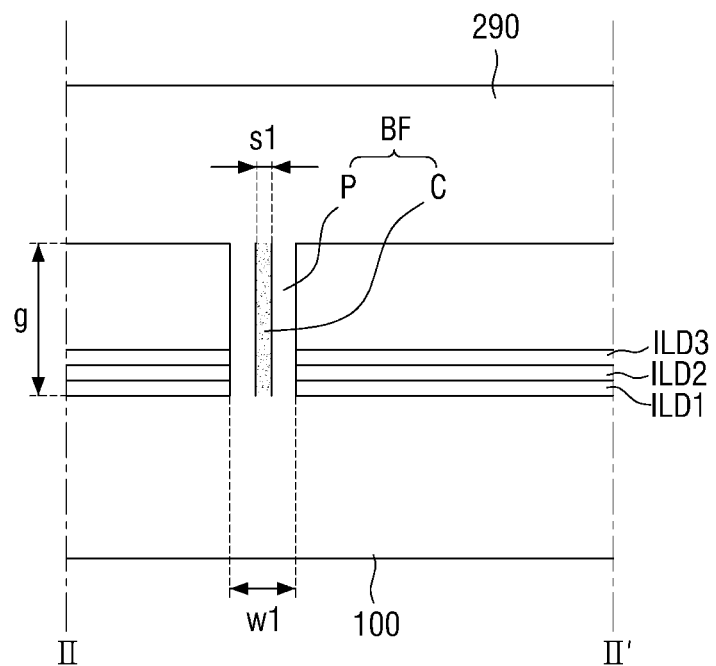
FIG. 3 is a cross-sectional view taken along line II-II' of FIG. 1.
Figure 3:
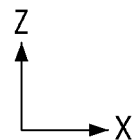

FIG. 1 is a schematic plan view of a display device according to an embodiment of the invention. FIG. 2 is a cross-sectional view taken along line I-I' of FIG. 1. FIG. 3 is a cross-sectional view taken along line II-II' of FIG. 1.

Referring to FIGS. 1 to 4, an embodiment of a display device according to the invention includes a first substrate 100, a second substrate 290, and a cell seal CS.

In an embodiment, the first substrate 100 may include a material such as glass, quartz or a polymer resin. In such an embodiment, the polymer resin may include polyethersulphone ("PES"), polyacrylate ("PA"), polyarylate ("PAR"), polyetherimide ("PEI"), polyethylenenaphthalate ("PEN"), polyethyleneterephthalate ("PET"), polyphenylenesulfide ("PPS"), polyallylate, polyimide ("PI"), polycarbonate ("PC"), cellulosetriacetate ("CAT"), cellulose acetate propionate ("CAP"), or a combination thereof.

The first substrate 100 may include a display area DA and a non-display area NDA.

The display area DA is defined as an area for displaying an image. A plurality of pixel units PX for realizing an image is disposed on the display area DA.

The non-display area NDA is disposed outside the display area DA, and is defined as an area not displaying an image. In an embodiment, the non-display area NDA may be disposed to surround the display area DA. Although FIG. 1 shows an embodiment where the non-display area NDA surrounds the display area DA, the invention is not limited thereto. In an alternative embodiment, the non-display area NDA may be disposed adjacent to only one side or the other side of the display area DA opposing the one side, or may be disposed adjacent to the one side and other opposing sides of the display area DA, respectively.

A driving integrated circuit 130 may be disposed in the non-display area NDA. The driving integrated circuit 130 may generate a signal for driving the display area DA and transmit the signal to the display area DA.

A plurality of conductive lines 160 may be disposed between the driving integrated circuit 130 and the display area DA. The plurality of conductive lines 160 may electrically connect the driving integrated circuit 130 and the display area DA. In an embodiment, the signal generated from the driving integrated circuit 130 may be transmitted to the display area DA through the plurality of conductive lines 160.

Hereinafter, a laminate structure of an embodiment of a display device according to the invention will be described with reference to FIG. 2.

In an embodiment, as shown in FIG. 2, a buffer layer 210 may be disposed on the first substrate 100. The buffer layer 210 may effectively prevent the penetration of moisture and oxygen from an outside through the first substrate 100. In such an embodiment, the buffer layer 210 may provide a planarized or flat surface on the first substrate 100. In an embodiment, the buffer layer 210 may include at least one of a silicon nitride ($SiN_x$) film, a silicon oxide ($SiO_2$) film, and a silicon oxynitride ($SiO_xN_y$) film. Alternatively, the buffer layer 210 may be omitted depending on the type of the first substrate 100, process conditions, and the like.

A semiconductor layer including a semiconductor pattern ACT may be disposed on the buffer layer 210. The semiconductor layer will be described based on the semiconductor pattern ACT. In an embodiment, the semiconductor pattern ACT may include or be formed of at least one selected from polycrystalline silicon, monocrystalline silicon, low-temperature polycrystalline silicon, amorphous silicon, and oxide semiconductor, or may be formed by mixing two or more thereof. In an embodiment, the semiconductor pattern ACT may include a channel region ACTa not doped with impurities, a source region ACTb doped with impurities, and a drain region ACTc doped with impurities. The source region ACTb is located at one side of the channel region ACTa, and is electrically connected with a source electrode SE to be described later. The drain region ACTc is located at the other side of the channel region ACTa, and is electrically connected with a drain electrode DE to be described later.

A first insulation layer 220 may be disposed on the semiconductor layer including the semiconductor pattern ACT. In an embodiment, the first insulation layer 220 may be a gate insulation layer. In an embodiment, the first insulation layer 220 may include or be formed of at least one selected from inorganic materials such as silicon oxide (SiOx) and silicon nitride (SiNx), and organic insulation materials such as benzocyclobutane ("BCB"), acrylic materials, and polyimide, or may be formed by mixing two or more thereof.

A gate conductor including a gate electrode GE may be disposed on the first insulation layer 220. The gate electrode GE may overlap the semiconductor pattern ACT. The gate conductor may include at least one of an aluminum (Al)-based metal including an aluminum alloy, a silver (Ag)-based metal including a silver, a copper (Cu)-based metal including a copper alloy, a molybdenum (Mo)-based metal including a molybdenum alloy, chromium (Cr), titanium (Ti), and tantalum (Ta).

A second insulation layer 230 may be disposed on the gate conductor including the gate electrode GE. The second insulation layer 230 may be formed of at least one selected from inorganic materials such as silicon oxide (SiOx) and silicon nitride (SiNx), and organic insulation materials such as BCB, acrylic materials, and polyimide, or may be formed by mixing two or more thereof.

A data conductor including a source electrode SE and a drain electrode DE may be disposed on the second insulation layer 230. The source electrode SE and the drain electrode DE are disposed to be spaced apart from each other on the second insulation layer 230. The data conductor may include at least one of a metal, an alloy, a metal nitride, a conductive metal oxide, and a transparent conductive material. In an embodiment, the data conductor may have a single layer structure or a multi-layer structure including nickel (Ni), cobalt (Co), titanium (Ti), silver (Ag), copper (Cu), molybdenum (Mo), aluminum (Al), beryllium (Be), niobium (Nb) Iron (Fe), selenium (Se) or tantalum (Ta). In an embodiment, an alloy formed by adding at least one selected from titanium (Ti), zirconium (Zr), tungsten (W), tantalum (Ta), niobium (Nb), platinum (Pt), and hafnium (Hf) to the above-listed metal may be used as the material of the source electrode SE and the drain electrode DE.

The semiconductor pattern ACT, gate electrode GE, source electrode SE, and drain electrode DE constitutes or collectively define a switching element TR2. Although FIG. 2 shows an embodiment where the switching element TR2 a top gate type switching element, the invention is not limited thereto. Alternatively, the switching element TR2 may be a bottom gate type switching element.

A planarization layer 240 may be disposed on the data conductor. The planarization layer 240 may increase the luminous efficiency of a pixel electrode 250 and an organic light emitting layer 270, which will be described later, by removing a level difference. In an embodiment, the planarization layer 240 may include an organic material. In one embodiment, for example, the planarization layer 240 may include at least one selected from polyimide, polyacryl, and polysiloxane. In an alternative embodiment, the planarization layer 240 may include an inorganic material, or may include a combination of an inorganic material and an organic material.

A first contact hole CNT1 exposing at least a part of the drain electrode DE may be defined in the planarization layer 240.

A pixel electrode 250 may be disposed on the planarization layer 240. The pixel electrode 250 may be electrically connected to the drain electrode DE exposed by the first contact hole CNT1. In an embodiment, the pixel electrode 250 may be an anode electrode which is a hole injection electrode. In such an embodiment, where the pixel electrode 250 is an anode electrode, the pixel electrode 250 may include a material having a high work function to facilitate hole injection. The pixel electrode 250 may be a reflective electrode, a semi-transmissive electrode, or a transmissive electrode. In an embodiment, the pixel electrode 250 may include a reflective material. The reflective material may include at least one selected from silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

In an embodiment, the pixel electrode 250 may be formed as a single layer film, but is not limited thereto. Alternatively, the pixel electrode 250 may be formed as a multi-layer film in which two or more materials are laminated.

In an embodiment, where the pixel electrode 250 may be formed as a multi-layer film or have a multi-layer structure, the pixel electrode 250 may include a reflective film and a transparent or semi-transparent electrode disposed on the reflective film. In an alternative embodiment, the pixel electrode 250 may include a reflective film and a transparent or semi-transparent electrode disposed under the reflective film. In one embodiment, for example, the pixel electrode 250 may have a three-layer structure of indium tin oxide ("ITO")/Ag/ITO, but the invention is not limited thereto.

Here, transparent or semi-transparent electrode may include at least one selected from ITO, indium zinc oxide ("IZO"), zinc oxide (ZnO), indium oxide ($In_2O_3$), indium gallium oxide ("IGO"), and aluminum zinc oxide ("AZO").

A pixel defining film 260 may be disposed on the pixel electrode 250. In the pixel defining film 260, an opening exposing at least a part of the pixel electrode 250 is defined. The pixel defining film 260 may include an organic material or an inorganic material. In an embodiment, the pixel defining film 260 may include a material such as a photoresist, a polyimide resin, an acrylic resin, a silicon compound, or a polyacrylic resin.

An organic light emitting layer 270 may be disposed on the pixel electrode 250 and the pixel defining film 260. In an embodiment, the organic light emitting layer 270 may be disposed on a region of the pixel electrode 250, which is exposed through the opening of the pixel defining film 260. In an embodiment, the organic light emitting layer 270 may cover at least a part of the side wall of the pixel defining film 260.

In an embodiment, the organic light emitting layer 270 may emit one of red light, green light, and blue light. In an alternative embodiment, the organic light emitting layer 270 may emit white light, or may emit one of cyan light, magenta light, and yellow light. In an embodiment, where the organic light emitting layer 270 emits white light, the organic light emitting layer 270 includes white light emitting material or has a laminate structure of a red light emitting layer, a green light emitting layer, and a blue light emitting layer, thereby emitting white light.

A common electrode 280 may be disposed on the organic light emitting layer 270 and the pixel defining film 260. In an embodiment, the common electrode 280 may be entirely formed or disposed entirely on the organic light emitting layer 270 and the pixel defining film 260. In an embodiment, the common electrode 280 may be a cathode electrode. In an embodiment, the common electrode 280 may include at least one selected from Li, Ca, Lif/Ca, LiF/Al, Al, Ag, and Mg. In an embodiment, the common electrode 280 may include or be made of a material having a low work function. In an embodiment, the common electrode 280 may be a transparent or semi-transparent electrode including at least one selected from ITO, IZO, zinc oxide (ZnO, indium oxide ($In_2O_3$), IGO, and AZO.

The pixel electrode 250, organic light emitting layer 270 and common electrode 280 may constitute or collectively define an organic light emitting diode OLED. However, the invention is not limited thereto, and the organic light emitting diode OLED may have a multi-layer structure including a hole injection layer ("HIL"), a hole transport layer ("HTL"), an electron transport layer ("ETL"), and an electron injection layer ("EIL").

In an embodiment, as shown in FIG. 1, the second substrate 290 may be connected to the first substrate 100 through a cell seal CS. The cell seal CS will be described in detail later.

In an embodiment, the second substrate 290 may be a transparent insulation substrate. In such an embodiment, where the second substrate 290 is a transparent insulation substrate, the transparent insulation substrate may be a glass substrate, a quartz substrate, or a transparent resin substrate.

Referring back to FIG. 1, a cell seal CS of an embodiment of a display device according to the invention will be described.

The cell seal CS may connect the first substrate 100 and the second substrate 290. The cell seal CS may be disposed in the non-display area NDA. In an embodiment, the cell seal CS may be disposed to surround the outer periphery of the display area DA. Accordingly, in such an embodiment, the display area DA may be sealed by the first substrate 100, the second substrate 290, and the cell seal CS.

The cell seal CS functions to seal the display area DA, and may have a closed shape in a plan view.

Although FIG. 1 illustrates an embodiment where the cell seal CS has a frame shape having a hollow portion, the enclosed shape of the cell seal CS is not limited thereto.

In an embodiment, the cell seal CS may include or be defined by a bonding filament BF.

Hereinafter, the laminate structure of the non-display area NDA including the bonding filament BF will be described.

In an embodiment, as shown in FIG. 3, at least one insulation film may be disposed on the first substrate 100. In an embodiment, the insulation film may include a first insulation film ILD1, a second insulation film ILD2, and a third insulation film ILD3.

In an embodiment, the first insulation film ILD1 may include or be made of the same material as the buffer layer 210 of the display area DA. In such an embodiment, the first insulation film ILD1 and the buffer layer 210 may be formed simultaneously in a same process, but the manufacturing method of the first insulation film ILD1 and the buffer layer 210 is not limited thereto.

In an embodiment, the second insulation film ILD2 may include or be made of a same material as the first insulation layer 220 of the display area DA. In such an embodiment, the second insulation film ILD2 and the first insulation layer 220 may be formed simultaneously in a same process.

In an embodiment, the third insulation film ILD3 may include or be made of a same material as the second insulation layer 230 of the display area DA. In such an embodiment, the third insulation film ILD3 and the second insulation layer 230 may be formed simultaneously in a same process.

Although FIG. 3 shows an embodiment where three insulation films are formed in the non-display area NDA, the number of insulation films is not limited thereto.

In an alternative embodiment, one or two selected from the first insulation film ILD1, the second insulation film ILD2 and the third insulation film ILD3 may be formed in the non-display area NDA.

The bonding filament BF may be disposed between the first substrate 100 and the second substrate 290. In an embodiment, the bonding filament BF may directly connect the first substrate 100 and the second substrate 290. In such an embodiment, the bonding filament BF may be directly connected to the first substrate 100 and the second substrate 290. In such an embodiment, the bonding filament BF may physically connect the first substrate 100 and the second substrate 290.

In an embodiment, the first substrate 100 and/or the second substrate 290 may include or be made of glass.

In such an embodiment, the bonding filament BF may include or be made of a same material as the glass forming the first substrate 100 and/or the second substrate 290.

In an embodiment, the width w1 of the bonding filament BF may be in a range of about 100 micrometers ($\mu$m) to about 200 $\mu$m. In such an embodiment, the width w1 of the bonding filament BF is substantially smaller than the width occupied by a conventional sealing member including a frit. Therefore, in such an embodiment, where the bonding filament BF is used, the area of the non-display area NDA may be reduced, and thus a display device having a narrow bezel structure may be realized.

The bonding filament BF may extend in a direction parallel to a Z-axis or a thickness direction of the first substrate 100.

In an embodiment, the bonding filament BF may include a central portion C and a peripheral portion P.

Figure 4:
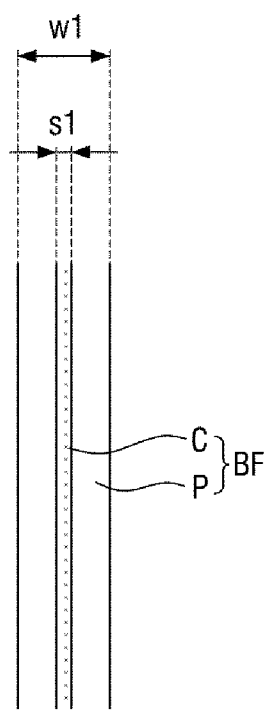
FIG. 4 is a partially enlarged view of the portion "A" of FIG. 1.

The peripheral portion P may be disposed to surround the central portion C. In an embodiment, as shown in FIG. 4, the peripheral portion P may be disposed on both sides of the central portion C on a cross-section.

In an embodiment, the peripheral portion P and the central portion C may be melted and hardened at different temperatures. Accordingly, the peripheral portion P and the central portion C may have different refractive indices from each other. As a result, in such an embodiment, the peripheral portion P and the central portion C may be visually recognized when viewed from a plan view as shown in FIG. 4. In such an embodiment, due to a process temperature difference, the peripheral portion P and the central portion C have different optical characteristics from each other, so that the peripheral portion P and the central portion C may be distinguished and visually recognized from each other.

In an embodiment, the width s1 of the central portion C may be in a range of about 20 $\mu$m to about 70 $\mu$m. Herein, a width may be defined as a distance in a width direction based on a plan view in the Z-axis direction, e.g., FIG. 1.

In an embodiment, the thickness g of the bonding filament BF may be in a range of about 4 $\mu$m to about 20 $\mu$m. In an embodiment, the cell gap between the first substrate 100 and the second substrate 290 may be about 20 $\mu$m or less. Thus, the bonding filament BF may have a thickness greater than or equal to the cell gap between the first substrate 100 and the second substrate 290, and may effectively connect the first substrate 100 and the second substrate 290.

In an embodiment, the bonding filament BF may be in contact with an insulation film.

In an embodiment, the bonding filament BF may extend from the first substrate 100 through a plurality of insulation films. In such an embodiment, the bonding filament BF may penetrate the first insulation film ILD1, the second insulation film ILD2, and the third insulation film ILD3.

In such an embodiment, a side surface of the bonding filament BF may be in contact with at least one of the plurality of insulation films.

Hereinafter, alternative embodiments of a display device according to the invention will be described. Some of configurations to be described below may be substantially the same as those in an embodiment of the display device according to the invention described above, and a repetitive detailed description thereof may be omitted for convenience of description.

Figure 5:
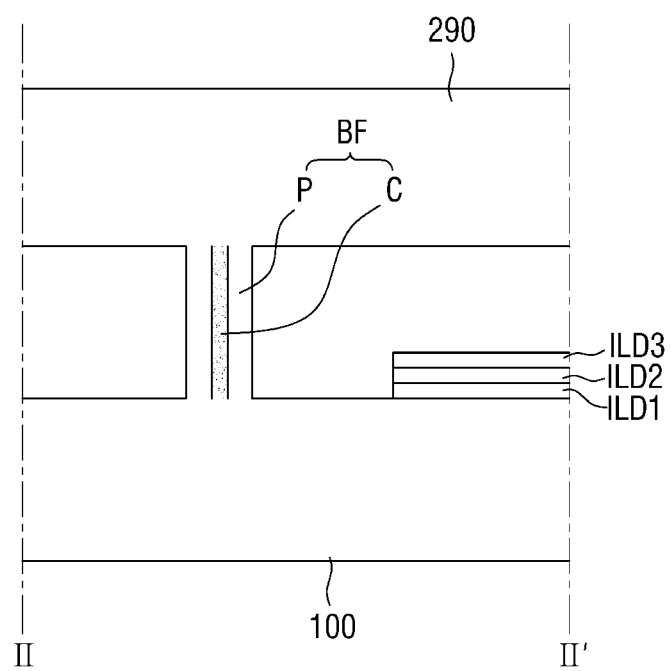
FIG. 5 is a cross-sectional view of a display device according to an alternative embodiment of the invention.
Figure 5:
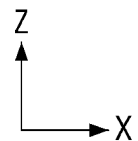

FIG. 5 is a cross-sectional view of a display device according to an alternative embodiment of the invention. Referring to FIG. 5, in an alternative embodiment, the bonding filaments BF may be spaced apart from the insulating film.

In an embodiment, the bonding filament BF may be spaced apart from the first insulation film ILD1, the second insulation film ILD2, and the third insulation film ILD3.

This structure may be a structure resulting from a manufacturing method of removing a plurality of insulation films and forming a bonding filament BF, as will be described later. The plurality of insulation films may be damaged by heat generated in the process of forming the bonding filament BF. In such an embodiment, where the insulation films and the bonding filament BF are spaced apart from each other as described above, the insulation films may be effectively prevented from being damaged during a manufacturing process of the bonding filament BF.

Figure 6:
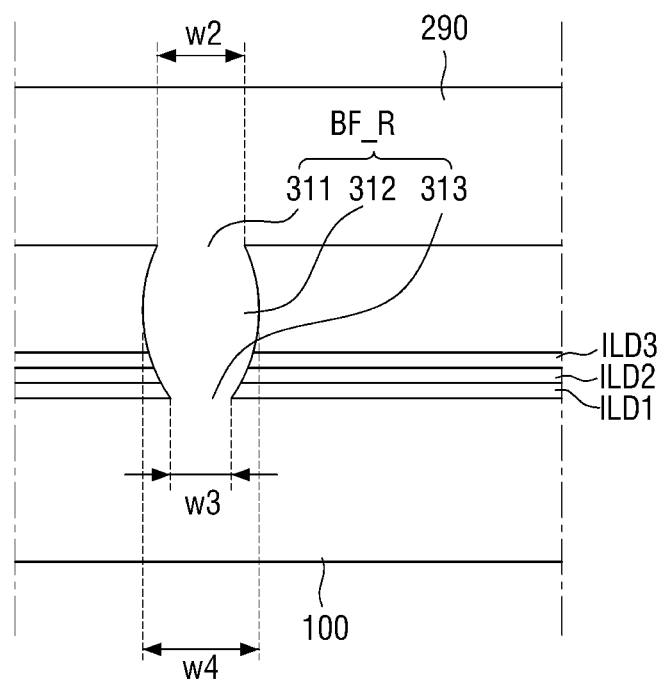
FIG. 6 is a cross-sectional view of a display device according to another alternative embodiment of the invention.
Figure 6:
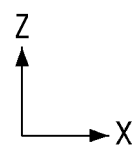

FIG. 6 is a cross-sectional view of a display device according to another alternative embodiment of the invention.

Referring to FIG. 6, in an embodiment of the display device, the widths of the upper end 311, middle end 312, and lower end 313 of a bonding filament BF_R may be different from each other.

In an embodiment, the bonding filament BF_R may include an upper end 311, a middle end 312, and a lower end 313.

The upper end 311 may be a portion where the bonding filament BF_R is connected to the second substrate 290, and the lower end 313 may be a portion where the bonding filament BF_R is connected to the first substrate 100.

The middle end 312 may be disposed between the upper end 311 and the lower end 313. The middle end 312 may be a portion between the upper end 311 and the lower end 313 and where the bonding filament BF_R has a maximum width.

In an embodiment, the width w4 of the middle end 312 may be in a range of about 60 μm to about 200 μm.

Each of the width w2 of the upper end 311 and the width w3 of the lower end 313 may be smaller than the width w4 of the middle end 312.

That is, the bonding filaments BFR may have a shape that becomes narrower from the center to both ends.

In an embodiment, the width w2 of the upper end 311 may be greater than the width w3 of the lower end 313. Such a structure may be formed in the manufacturing method to be described later, where the width of a portion adjacent to the focal point of a laser is relatively smaller than the width of a portion far from the focal point thereof.

That is, such a width difference may be caused by a method of forming the bonding filaments BF_R by disposing the focal point of the laser in the first substrate 100 adjacent to the lower end 313.

Figure 7:
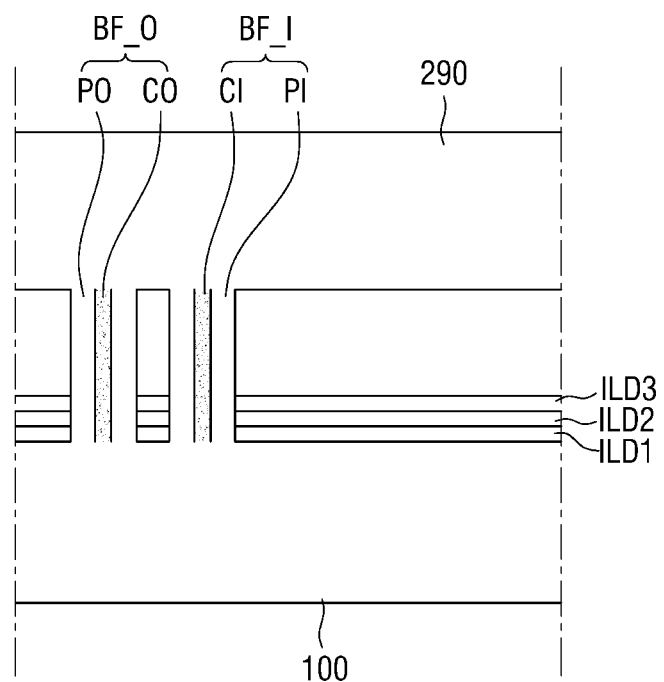
FIG. 7 is a cross-sectional view of a display device according to another alternative embodiment of the invention.

FIG. 7 is a cross-sectional view of a display device according to another alternative embodiment of the invention.

Referring to FIG. 7, in an embodiment, a bonding filament may include an outer bonding filament BF_O and an inner bonding filament BF_I.

The inner bonding filament BF_I refers to a bonding filament whose lower end is relatively close to the display area DA, and the outer bonding filament BF_O refers to a bonding filament whose lower end is relatively far from the display area DA.

In an embodiment, the outer bonding filament BF_O and the inner bonding filament BF_I may be spaced apart from each other.

In an embodiment, the outer bonding filament BF_O may include a central portion CO and a peripheral portion PO. In such an embodiment, the inner bonding filament BF_I may include a central portion CI and a peripheral portion PI.

The outer bonding filament BF_O and the inner bonding filament BF_I may be substantially the same as the bonding filament described above. In such an embodiment, the central portion CO and peripheral portion PO of the outer bonding filament BF_O and the central portion CI and peripheral portion PI of the inner bonding filament BF_I may be substantially the same as those described above with reference to FIGS. 3 and 4.

In an embodiment, the outer bonding filament BF_O and the inner bonding filament BF_I may extend in a direction parallel to each other. In an embodiment, as shown in FIG. 7, the outer bonding filament BF_O and the inner bonding filament BF_I may extend in parallel in a direction parallel to the Z-axis.

Figure 8:
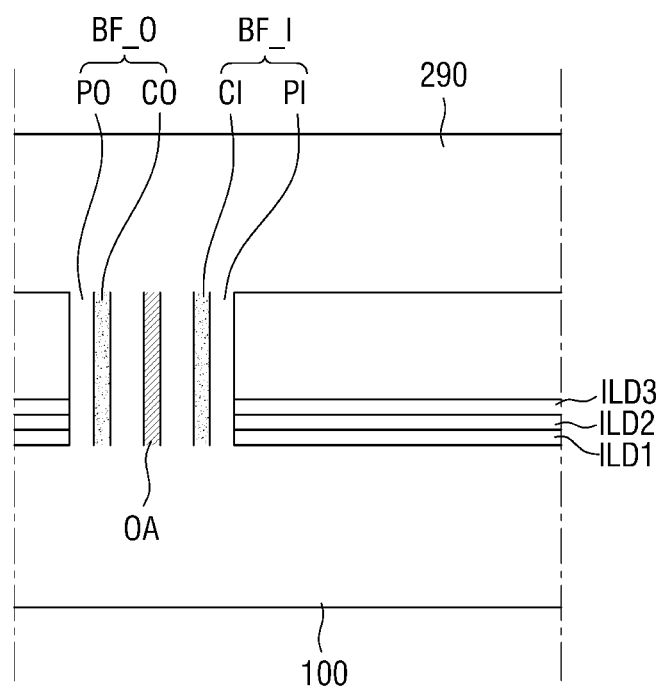
FIG. 8 is a cross-sectional view of a display device according to another alternative embodiment of the invention.

FIG. 8 is a cross-sectional view of a display device according to another alternative embodiment of the invention.

Referring to FIG. 8, in an embodiment, the outer bonding filament BF_O and the inner bonding filament BF_I may at least partially overlap each other.

In an embodiment, the peripheral portion PO of the outer bonding filament BF_O and the peripheral portion PI of the inner bonding filament BF_I overlap each other to form an overlap area OA.

The overlap area OA may be different from the peripheral portion PO of the outer bonding filament BF_O and the peripheral portion PI of the inner bonding filament BF_I in optical characteristics. In one embodiment, for example, the refractive index of the overlap area OA may be different from the refractive index of the peripheral portion PO of the outer bonding filament BF_O and the refractive index of the peripheral portion PI of the inner bonding filament BF_I. Thus, the overlap area OA may be distinguished and visually recognized from the peripheral portion PO of the outer bonding filament BF_O and the peripheral portion PI of the inner bonding filament BF_I.

Figure 9:
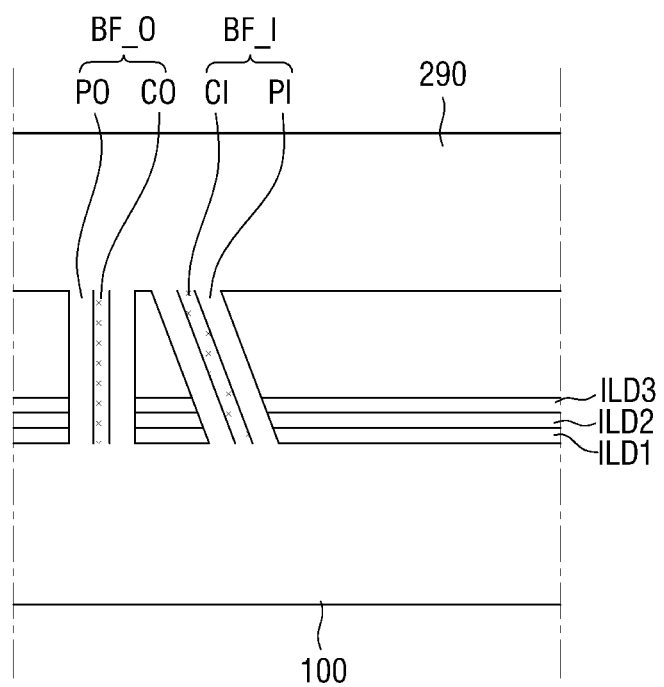
FIG. 9 is a cross-sectional view of a display device according to another alternative embodiment of the invention.

FIG. 9 is a cross-sectional view of a display device according to another alternative embodiment of the invention.

Referring to FIG. 9, in an embodiment, at least one of the outer bonding filament BF_O and the inner bonding filament BF_I may extend at a predetermined inclination angle.

FIG. 9 illustrates an embodiment where the inner bonding filament BF_I is inclined. Such a structure may be formed in the manufacturing method to be described later, where a femtosecond laser is radiated at a predetermined inclination angle.

The inner bonding filament BF_I may be inclined at a predetermined angle (for example, an acute angle) with respect to inclined with respect to a thickness direction of the first substrate 100 or the Z-axis. In such an embodiment, where the inner bonding filament BF_I is inclined, the upper end of the inner bonding filament BF_I may be disposed at the outer side, as compared with the lower end of the inner bonding filament BF_I. In such an embodiment, the upper end of the inner bonding filament BF_I may be disposed closer to the outer bonding filament BF_O, as compared with the lower end thereof.

Figure 10:
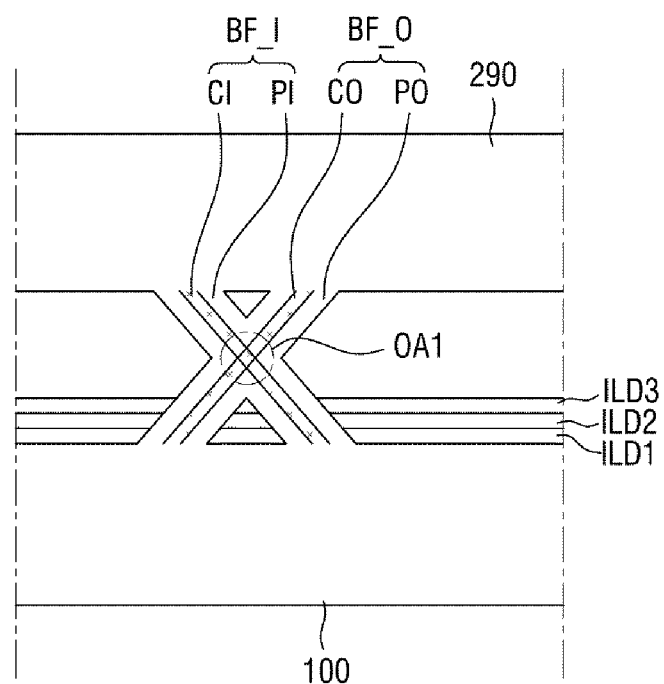
FIG. 10 is a cross-sectional view of a display device according to another alternative embodiment of the invention.

FIG. 10 is a cross-sectional view of a display device according to another alternative embodiment of the invention.

Referring to FIG. 10, in an embodiment, the outer bonding filament BF_O and the inner bonding filament BF_I may extend to cross each other.

In such an embodiment, the central portion CI of the inner bonding filament BF_I and the central portion CO of the outer bonding filament BF_O may cross each other to overlap each other.

The inner bonding filament BF_I and the outer bonding filament BF_O may cross each other to have an X-like shape on the cross section. In such an embodiment, the upper end of the inner bonding filament BF_I may be disposed outside the upper end of the outer bonding filament BF_O.

An overlap area OA1 may be formed at a portion where the inner bonding filament BF_I and the outer bonding filament BF_O cross each other.

The overlap area OA1 may be different from the inner bonding filament BF_I and the outer bonding filament BF_O in optical characteristics (for example, refractive index). Thus, the overlap area OA1 may be distinguished and visually recognized from the inner bonding filament BF_I and the outer bonding filament BF_O. When the inner bonding filament BF_I and the outer bonding filament BF_O cross each other, the first substrate 100 and the second substrate 290 may be more firmly connected with each other.

Figure 11:
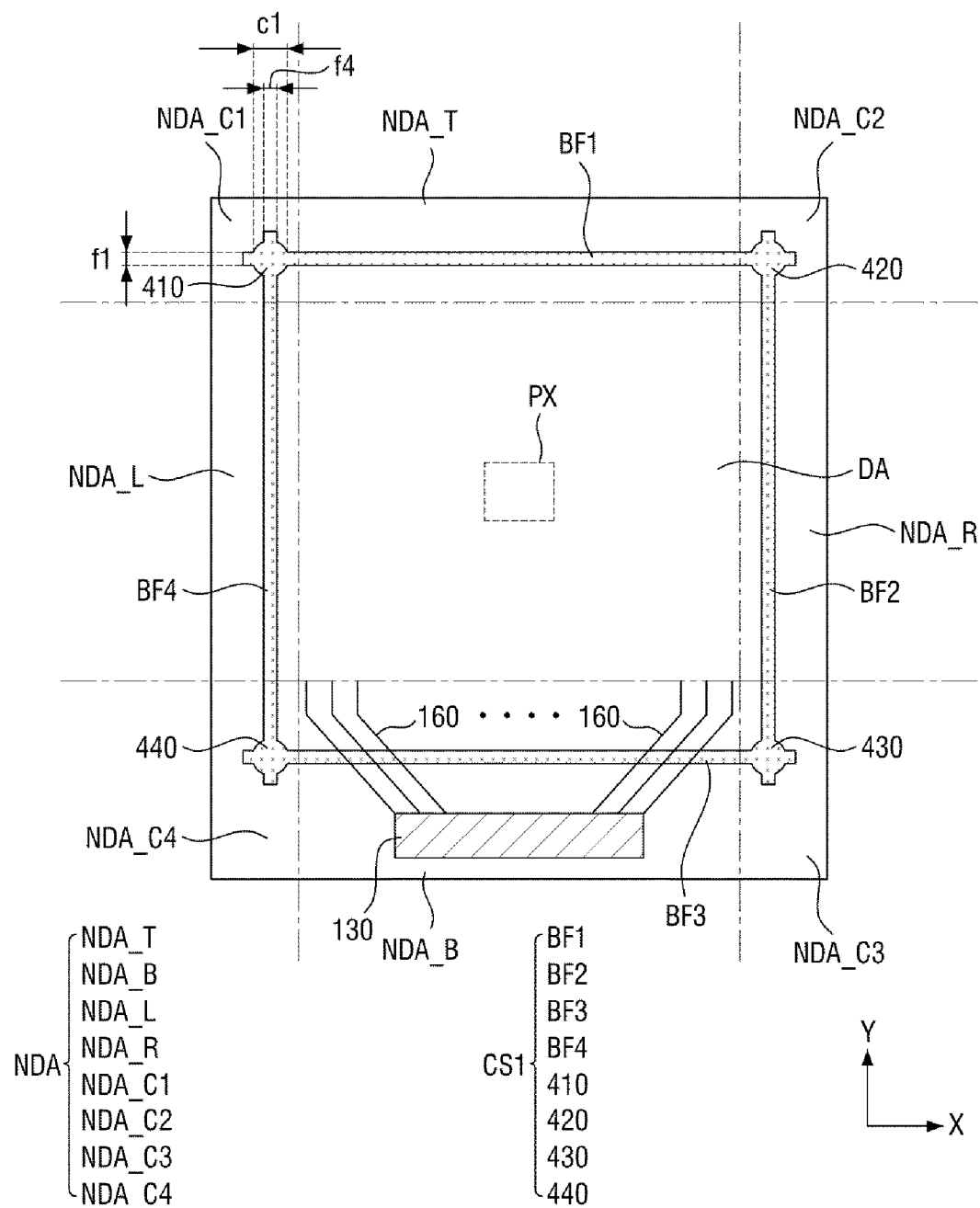
FIG. 11 is a schematic plan view of a display device according to another alternative embodiment of the invention.

FIG. 11 is a schematic plan view of a display device according to another alternative embodiment of the invention.

Referring to FIG. 11, in another alternative embodiment, a cell seal CS1 may include a first bonding filament BF1, a second bonding filament BF2, a third bonding filament BF3, and a fourth bonding filament BF4, which cross on another.

For convenience of description, a non-display area NDA may be divided as shown in FIG. 11.

A non-display area NDA may include an upper non-display area NDA_T disposed on the upper side of a display area DA in FIG. 11, a lower non-display area NDA_B disposed on the lower side of the display area DA in FIG. 11, a left non-display area NDA_L disposed on the left side of the display area DA in FIG. 11, and a right non-display area NDA_R disposed on the right side of the display area DA in FIG. 11.

In such an embodiment, as described above, the driving integrated circuit 130 and the plurality of conductive lines 160 may be formed in the lower non-display area NDA_B.

In such an embodiment, the non-display area NDA may further include a first corner non-display area NDA_C1, a second corner non-display area NDA_C2, a third corner non-display area NDA_C3, and a fourth corner non-display area NDA_C4, which are disposed at four corners, respectively.

In an embodiment, the first bonding filament BF1 and the third bonding filament BF3 may extend in a direction parallel to the X-axis. In such an embodiment, each of the first bonding filaments BF1 and the third bonding filaments BF3 may have a bar shape extending in a direction parallel to the X-axis when viewed from a plan view.

The first bonding filament BF1 may be disposed over or extend to overlap the first corner non-display area NDA_C1, the upper non-display area NDA_T and the second corner non-display area NDA_C2, and the third bonding filament BF3 may be disposed over or extend to overlap the third corner non-display area NDA_C3, the lower non-display area NDA_B and the fourth corner non-display area NDA_C4.

In an embodiment, the second bonding filament BF2 and the fourth bonding filament BF4 may extend in a direction parallel to the Y-axis. In such an embodiment, each of the second bonding filament BF2 and the fourth bonding filament BF4 may have a bar shape extending in a direction parallel to the Y-axis when viewed from a plan view.

In an embodiment, the second bonding filament BF2 may be disposed over or extend to overlap the second corner non-display area NDA_C2, the right non-display area NDA_R and the third corner non-display area NDA_C3, and the fourth bonding filament BF4 may be disposed over or extend to overlap the fourth corner non-display area NDA_C4, the left non-display area NDA_L and the first corner non-display area NDA_C1.

In an embodiment, the cell seal CS1 may include a first intersection portion 410 formed by intersecting (or defined by an intersection area of) the first bonding filament BF1 and the fourth bonding filament BF4, a second intersection portion 420 formed by intersecting the first bonding filament BF1 and the second bonding filament BF2, a third intersection portion 430 formed by intersecting the second bonding filament BF2 and the third bonding filament BF3, and a fourth intersection portion 440 formed by intersecting the third bonding filament BF3 and the fourth bonding filament BF4.

The first intersection portion 410 may be disposed in the first corner non-display area NDA_C1, the second intersection portion 420 may be disposed in the second corner non-display area NDA_C2, the third intersection portion 430 may be disposed in the third corner non-display area NDA_C3, and the fourth intersection portion 440 may be disposed in the fourth corner non-display area NDA_C4.

The first intersection portion 410, the second intersection portion 420, the third intersection portion 430, and the fourth intersection portion 440 may have substantially the same shape. Hereinafter, for convenience of description, the first intersection portion 410 will be described in detail. The description of the first intersection portion 410 may also be applied to the second intersection portion 420, the third intersection portion 430 and the fourth intersection portion 440.

In an embodiment, as shown in FIG. 11, the width c1 of the first intersection portion 410 may be greater than the width f1 of the first bonding filament BF1 and the width f4 of the fourth bonding filament BF4. In such an embodiment, the first filament BF1 and the fourth filament BF4 may extend to cross each other at the first intersection portion 410.

The outer periphery of the first intersection portion 410 may be at least partially curved.

One end of the first bonding filament BF1 and one end of the fourth bonding filament BF4 may protrude from the first intersection portion 410 at regular intervals. One end of the first bonding filament BF1 and one end of the fourth bonding filament BF4 may protrude in different directions from each other. In an embodiment, one end of the first bonding filament BF1 may extend in a direction parallel to the X-axis, and one end of the fourth bonding filament BF4 may extend in a direction parallel to the Y-axis.

Such a protruding feature may be the same as those at the second intersection portion 420, the third intersection portion 430, and the fourth intersection portion 440. Therefore, the cell seal CS1 may have a "#" shape when viewed from a plan view.

Figure 12:
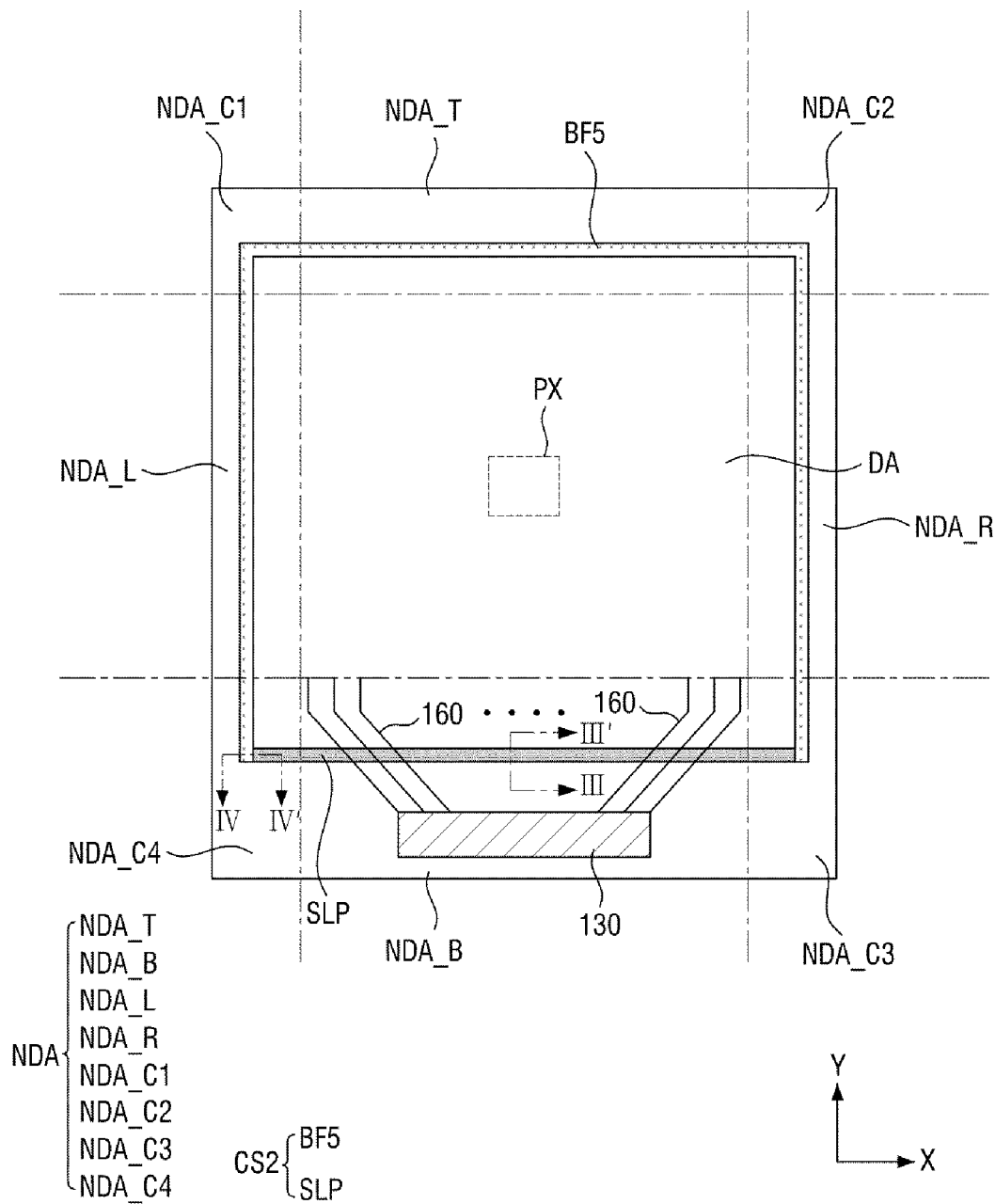
FIG. 12 is a schematic plan view of a display device according to another alternative embodiment of the invention.
Figure 13:
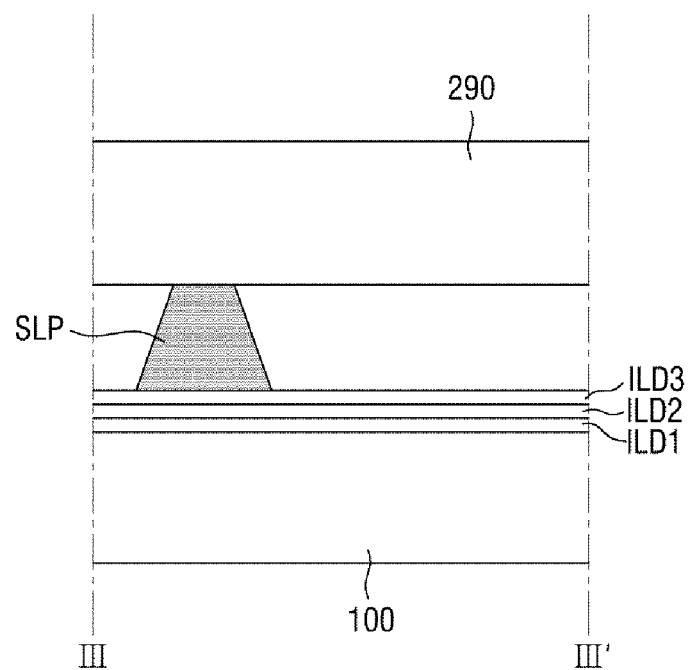
FIG. 13 is a cross-sectional view taken along line III-III' of FIG. 12.
Figure 14:
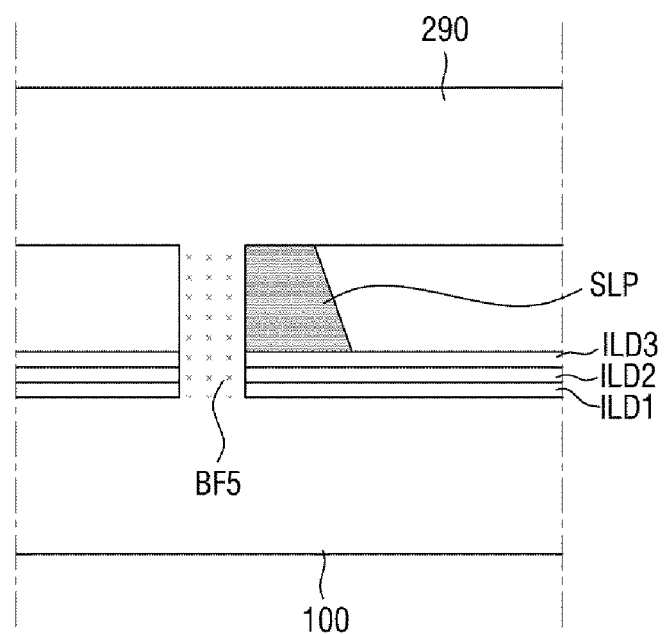
FIG. 14 is a cross-sectional view taken along line IV-IV' of FIG. 12.

FIG. 12 is a schematic plan view of a display device according to another alternative embodiment of the invention. FIG. 13 is a cross-sectional view taken along line of FIG. 12. FIG. 14 is a cross-sectional view taken along line IV-IV' of FIG. 12.

Referring to FIG. 12, in another alternative embodiment, a cell seal CS2 may include a bonding filament BF5 and a frit seal SLP.

In an embodiment, the frit seal SLP may be disposed between the display area DA and the driving integrated circuit 130. The frit seal SLP may include a plurality of frits. In such an embodiment, the frit seal SLP may be a resultant product formed by melting the plurality of frits.

The frit seal SLP may extend in a direction parallel to the X-axis. Specifically, the frit seal SLP may be disposed over the fourth corner non-display area NDA_C4, the lower non-display area NDA_B, and the third corner non-display area NDA_C3.

The frit seal SLP may cross the conductive lines 160 when viewed from a plan view. In an embodiment, the frit seal SLP may at least partially overlap the conductive lines 160.

Both ends of the frit seal SLP may be connected to the bonding filament BF5. In an embodiment, the frit seal SLP and the bonding filament BF5 may be in contact with each other in the third corner non-display area NDA_C3 and the fourth corner non-display area NDA_C4. However, the invention is not limited thereto. In an alternative embodiment, the frit seal SLP and the bonding filament BF5 may also be in contact with each other in the lower non-display area NDA_B.

The frit seal SLP and the bonding filament BF5 may form a closed curve, thereby sealing the display area DA. In an embodiment, as shown in FIG. 14, one side of the bonding filament BF5 may be in contact with the frit seal SLP.

Although FIG. 12 illustrates an embodiment where the bonding filament BF5 is continuously formed, the invention is not limited thereto. In an alternative embodiment, as shown in FIG. 11, the bonding filament BF5 may include a plurality of bonding filaments extending in one direction. Each of the bonding filaments may be independently formed and then connected to each other. In such an embodiment, the display device may have a structure in which the third bonding filament BF3 in the embodiment of FIG. 11 is replaced by the frit seal SLP.

Referring to FIG. 13, the frit seal SLP may be disposed on the insulation film. FIG. 13 illustrates an embodiment where the frit seal SLP overlaps the first insulation film ILD1, the second insulation film ILD2 and the third insulation film ILD3, but the number of the insulation films overlapping the frit seal SLP is not limited thereto. In an alternative embodiment, the frit seal may be disposed to overlap one or two insulation films.

The frit seal SLP may serve to connect the first substrate 100 and the second substrate 290.

The process temperature for forming the bonding filament is relatively high compared to the process temperature for forming the frit seal. That is, if the bonding filament is formed at a place where the conductive lines are present, the conductive lines may be damaged by high process temperature for forming the bonding filament. In an embodiment, the frit seal is used for the portion overlapping the conductive lines and the bonding filament is used for the remaining portion, such that the conductive lines may be effectively prevented from being damaged by heat while implementing a low bezel structure.

Hereinafter, embodiments of a method of manufacturing a display device according to the invention will be described. Some of configurations to be described below may be substantially the same as those in an embodiment of the display device described above, and a repetitive detailed description thereof may be omitted for convenience of description.

Figure 15:
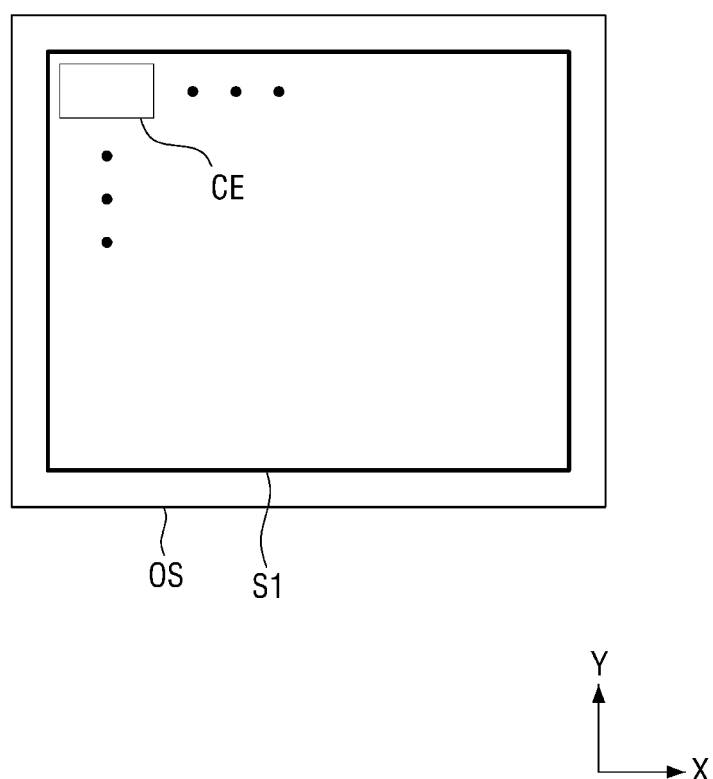
FIG. 15 is a schematic plan view for explaining a method of manufacturing a display device according to an embodiment of the invention.

FIG. 15 is a schematic plan view for explaining a method of manufacturing a display device according to an embodiment of the invention.

Figure 16:
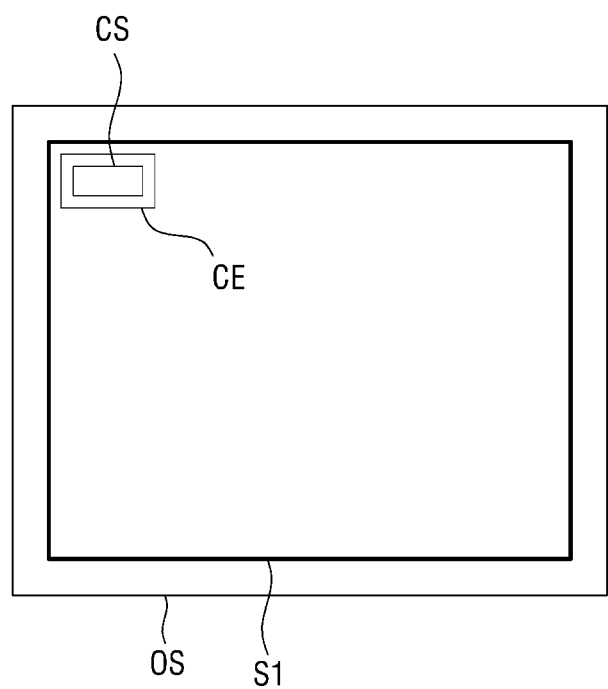
FIG. 16 is a schematic plan view for explaining a method of manufacturing a display device according to an embodiment of the invention.

FIG. 16 is a schematic plan view for explaining a method of manufacturing a display device according to an embodiment of the invention.

Referring to FIGS. 15 and 16, an embodiment of a method of manufacturing a display device according to the invention may include: sealing an original panel OS including a cell CE including a first substrate 100 and a second substrate 290 facing each other; and forming a cell seal CS to sealing the cell CE. Here, the process of forming the cell seal CS may include forming a bonding filament BF for connecting the first substrate 100 and the second substrate 290.

In an embodiment, the original panel OS may include an upper substrate (not shown) and a lower substrate (not shown) facing each other. In such an embodiment, the first substrate 100 of the display device may be a part of the lower substrate of the original panel OS, and the second substrate 290 thereof may be a part of the upper substrate of the original panel OS.

The original panel OS may include a plurality of cells CE. One cell may constitute an embodiment of the display device according the invention. The plurality of cells CE may be arranged in a matrix form having a plurality of rows and a plurality of columns.

A sealing member S1 may be disposed outside the plurality of cells CE along the edge of the original panel OS. That is, the original panel OS may be sealed by curing the sealing member S1. When the original panel OS is sealed, the plurality of cells CE herein are also sealed, such that oxygen or moisture may be effectively prevented from permeating from an outside.

Subsequently, referring to FIG. 16, a process of forming a cell seal CS sealing the cell CE may be performed.

The cell seal CS may be substantially the same as that in an embodiment described above.

The process of forming the cell seal CS may include forming a bonding filament BF connecting the first substrate 100 and the second substrate 290 by radiating a first sub laser L1.

The step of forming a bonding filament BF connecting the first substrate 100 and the second substrate 290 by radiating a first sub laser L1 will hereinafter be described in detail with reference to FIGS. 17 and 18.

Figure 17:
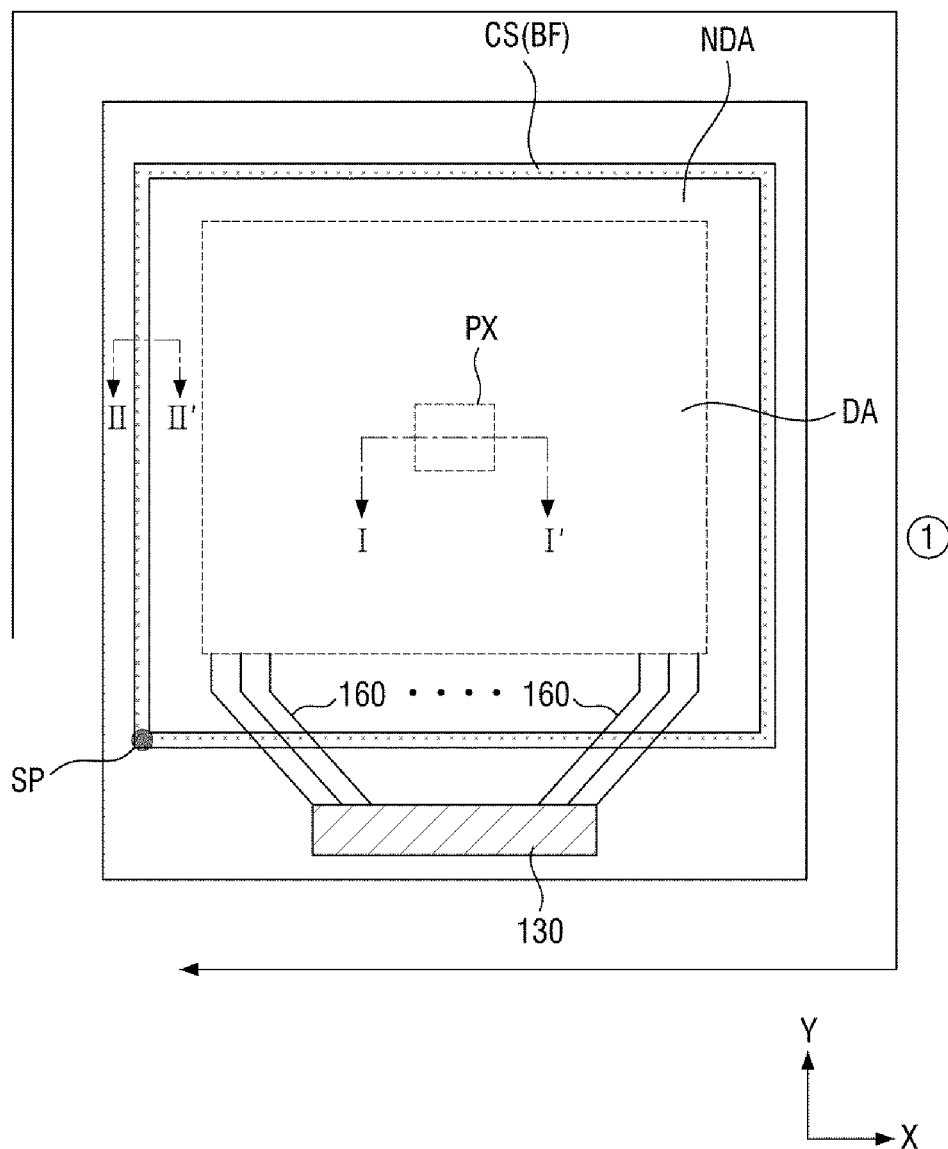
FIG. 17 is a schematic plan view for explaining a method of manufacturing a display device according to an embodiment of the invention.

FIG. 17 is a schematic plan view for explaining a method of manufacturing a display device according to an embodiment of the invention.

Figure 18:
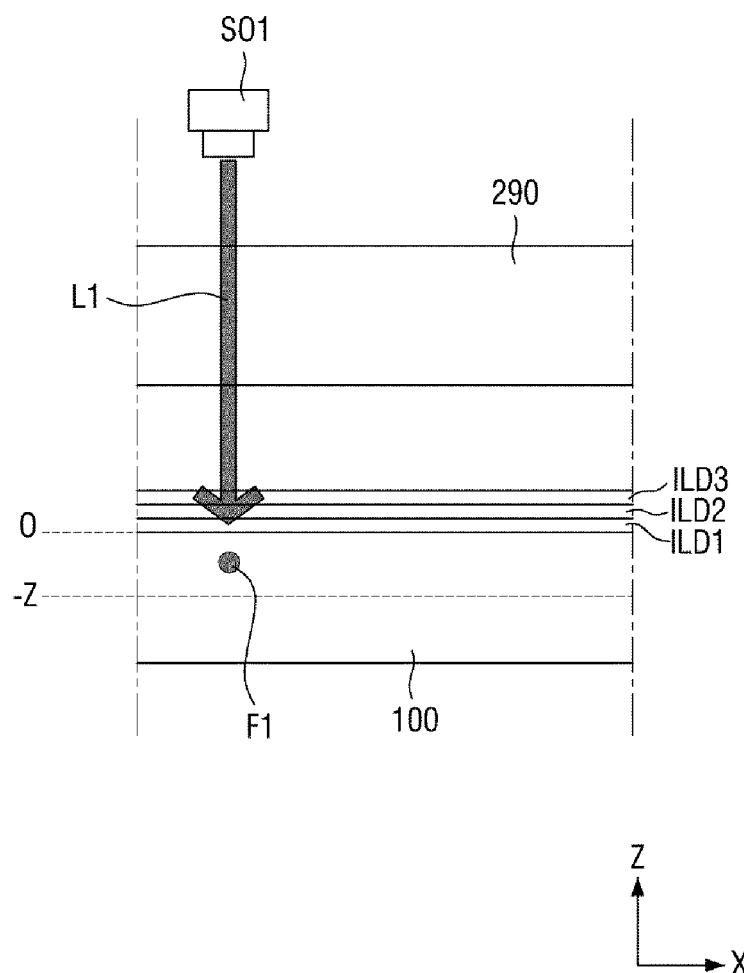
FIG. 18 is a cross-sectional view for explaining a method of manufacturing a display device according to an embodiment of the invention.

FIG. 18 is a cross-sectional view for explaining a method of manufacturing a display device according to an embodiment of the invention.

Referring to FIG. 17, in an embodiment, the process of radiating the first sub laser L1 may include continuously radiating the first sub laser L1 to form the cell seal CS having a closed polygon shape.

In an embodiment, the first sub laser L1 may be a femtosecond laser. As used herein, the "femtosecond laser" refers to a laser having a pulse width in a range of 200 femtoseconds to 500 femtoseconds.

In an embodiment, the first sub laser L1 may be continuously radiated. In such an embodiment, as shown in FIG. 17, the radiation of the first sub laser L1 may start at a starting point SP, proceed along the outer periphery of the display area DA, and end at the starting point SP (refer to arrow ①). Thus, a cell seal CS having a closed polygon shape may be formed. The shape of the cell seal CS may be the same as that in an embodiment of the display device described above.

Referring to FIG. 18, the first sub laser L1 may be radiated toward the first substrate 100 from above the second substrate 290. The focal point F1 of the first sub laser L1 may be set inside the first substrate 100.

For convenience of description, the reference of focus depth will be defined. The upper surface of the first substrate 100 may be defined as a point having a focus depth of "0". Further, inside the first substrate 100, the focus depth at a point where a distance from the upper surface of the first substrate 100 is Z may be defined as −Z.

In an embodiment, the focus depth of the first sub laser L1 may be in a range of about −100 μm to about zero (0) μm.

In such an embodiment, where the focus depth of the first sub laser L1 is in a range of about −100 μm to about zero (0) μm, when the first sub laser L1 is radiated, high energy may be provided around the first focal point F1. The provided energy may plasma-treat the first substrate 100 and the second substrate 290. A part of the plasma-treated first substrate 100 and a part of the plasma-treated second substrate 290 may melt and grow. In such an embodiment, a part of the plasma-treated second substrate 290 may melt and grow in a negative direction of the Z-axis, and a part of the plasma-treated first substrate 100 may melt and grow in a positive direction of the Z-axis, so that the part of the plasma-treated second substrate 290 and the part of the plasma-treated first substrate 100 may meet with each other. In such an embodiment, the part of the plasma-treated second substrate 290 and the part of the plasma-treated first substrate 100 may meet with each other to form the central portion C of the bonding filament BF (refer to FIG. 3).

Heat is generated around the plasma-treated central portion C, and this heat may melt the periphery of the central portion C. Thus, the peripheral portion P of the bonding filament BF may be formed to surround the central portion C. The peripheral portion P of the bonding filament BF, similarly to the central portion C of the bonding filament BF, may also connect the first substrate 100 and the second substrate 290.

However, since the melting temperatures of the peripheral portion P and the central portion C are different from each other, the optical characteristics of both may be different from each other. In one embodiment, for example, the refractive indices of the peripheral portion P and the central portion C are different from each other, so that the peripheral portion P and the central portion C may be visually recognized and distinguished from each other.

Since the specific shape of the formed bonding filament BF is substantially the same as that in an embodiment of the display device described above, any repetitive detailed description thereof will be omitted.

Hereinafter, alternative embodiments of a method of manufacturing a display device according to the invention will be described.

Figure 19:
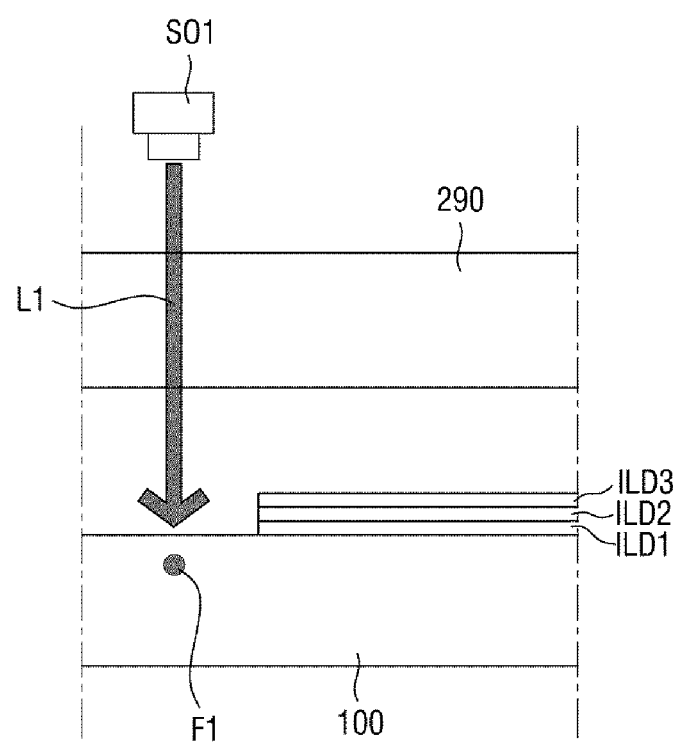
FIG. 19 is a cross-sectional view for explaining a method of manufacturing a display device according to an alternative embodiment of the invention.

FIG. 19 is a cross-sectional view for explaining a method of manufacturing a display device according to an alternative embodiment of the invention.

Referring to FIG. 19, an embodiment of the method of manufacturing a display device according to the invention may further include removing the insulation film formed on the first substrate 100.

In an embodiment, a process of at least partially removing the insulation film formed on the first substrate 100 may performed before radiating the first sub laser L1. In such an embodiment, as described above, the first sub laser L1 induces a high temperature, and thus a thermal damage may be applied to the structure near the first focal point F1. Therefore, as shown in FIG. 19, the insulation films ILD1, ILD2 and ILD3 formed on the first substrate 100 may be removed to prevent such thermal damage.

In such an embodiment, the first focal point F1 may not overlap the insulation film formed on the first substrate 100.

In such an embodiment, where the first sub laser L1 is radiated after removing the insulation film, the insulation film is effectively prevented from being damaged by heat.

Figure 20:
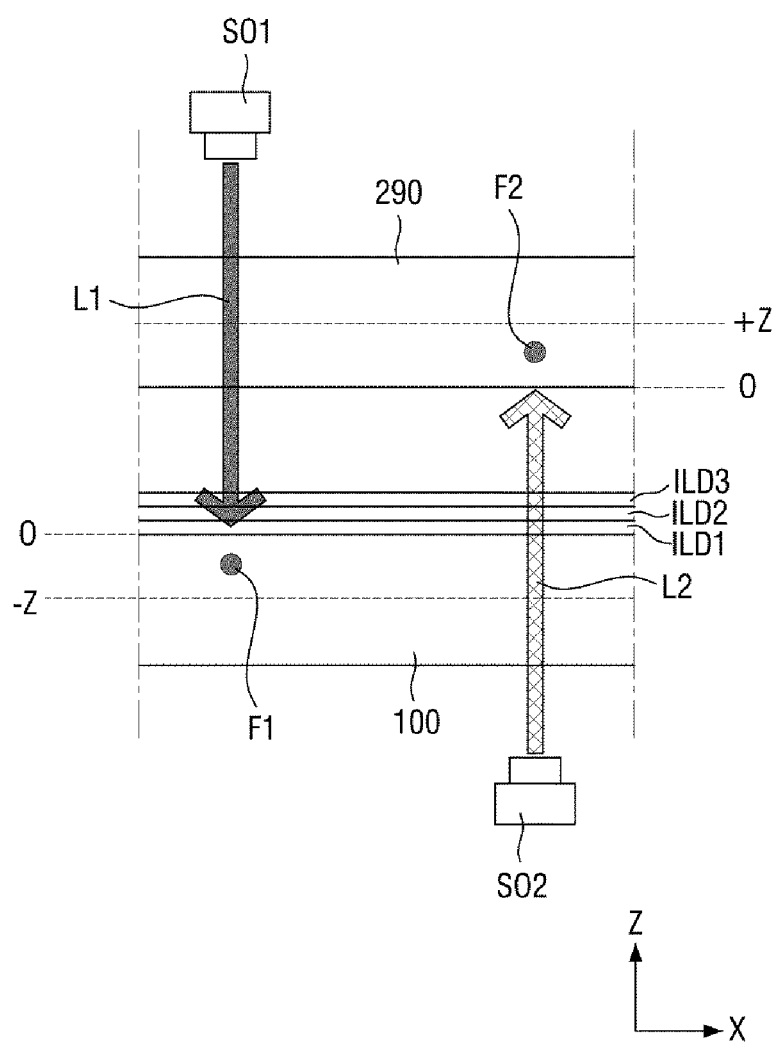
FIG. 20 is a cross-sectional view for explaining a method of manufacturing a display device according to another alternative embodiment of the invention.

FIG. 20 is a cross-sectional view for explaining a method of manufacturing a display device according to another alternative embodiment of the invention.

Referring to FIG. 20, the process of forming the bonding filament BF connecting the first substrate 100 and the second substrate 290 by radiating a laser may include radiating the sub laser L1 to the first substrate 100 from above the second substrate and radiating a second sub laser L2 to the second substrate 290 from below the first substrate 100.

The first sub laser L1 may be substantially the same as that described above with reference to FIG. 19.

The second sub laser L2 may be provided from a second sub laser source SO2.

The second sub laser L2 may be a femtosecond laser which is the same as the first sub laser L1.

The second sub laser L2 may be radiated toward the second substrate 290 from below the first substrate 100. In such an embodiment, the second focal point F2 of the second sub laser may be set inside the second substrate 290.

For convenience of description, the reference of focus depth will be defined. The upper surface of the second substrate 290 may be defined as a point having a focus depth of "0". Further, inside the second substrate 290, the focus depth at a point where a distance from the lower surface of the second substrate 290 is Z may be defined as +Z.

In an embodiment, the focus depth of the second sub laser L2 may be in a range of about (0) μm to about 100 μm.

In such an embodiment, where the focus depth of the second sub laser L2 is in a range of about (0) μm to about 100 μm, when the second sub laser L2 is radiated, high energy may be provided around the second focal point F2. The provided energy may plasma-treat the first substrate 100 and the second substrate 290. A part of the plasma-treated first substrate 100 and a part of the plasma-treated second substrate 290 may melt and grow. In such an embodiment, a part of the plasma-treated second substrate 290 may melt and grow in a negative direction of the Z-axis, and a part of the plasma-treated first substrate 100 may melt and grow in a positive direction of the Z-axis, such that the part of the plasma-treated second substrate 290 and the part of the plasma-treated first substrate 100 may meet with each other. In such an embodiment, the part of the plasma-treated second substrate 290 and the part of the plasma-treated first substrate 100 may meet with each other to form the central portion C of the bonding filament BF (refer to FIG. 3).

Heat is generated around the plasma-treated central portion C, and this heat may melt the periphery of the central portion C. Thus, the peripheral portion P of the bonding filament BF may be formed to surround the central portion C. The peripheral portion P of the bonding filament BF, similarly to the central portion C of the bonding filament BF, may also connect the first substrate 100 and the second substrate 290.

However, since the melting temperatures of the peripheral portion P and the central portion C are different from each other, the optical characteristics of both may be different from each other. In one embodiment, for example, the refractive indices of the peripheral portion P and the central portion C are different from each other, so that the peripheral portion P and the central portion C may be visually recognized and distinguished from each other.

The first focal point F1 may be formed at the inner side compared to the second focal point F2.

Thus, the outer bonding filament BF_O may be formed by the first sub laser L1, and the inner bonding filament BF_I may be formed by the second sub laser L2.

In an embodiment, the first sub laser source SO1 and the second sub laser source SO2 may be independently driven.

In an alternative embodiment, the first sub laser source SO1 and the second sub laser source SO2 may be formed by separating one laser source using a beam splitter (not shown). In such an embodiment, one laser provided from a laser source may be separated into the first sub laser L1 and the second sub laser L2 by a beam splitter.

The resultant product of the method of manufacturing a display device according to the embodiment of FIG. 20 may be substantially the same as that of the display device described above with reference to FIG. 7.

In an alternative embodiment, the first focal point F1 and the second focal point F2 may be brought close to each other in the X-axis direction. In such an embodiment, when the first focal point F1 and the second focal point F2 are brought close to each other, as shown in FIG. 8, the inner bonding filament BF_I and the outer bonding filament BF_O overlap each other to form the overlap area OA.

Figure 21:
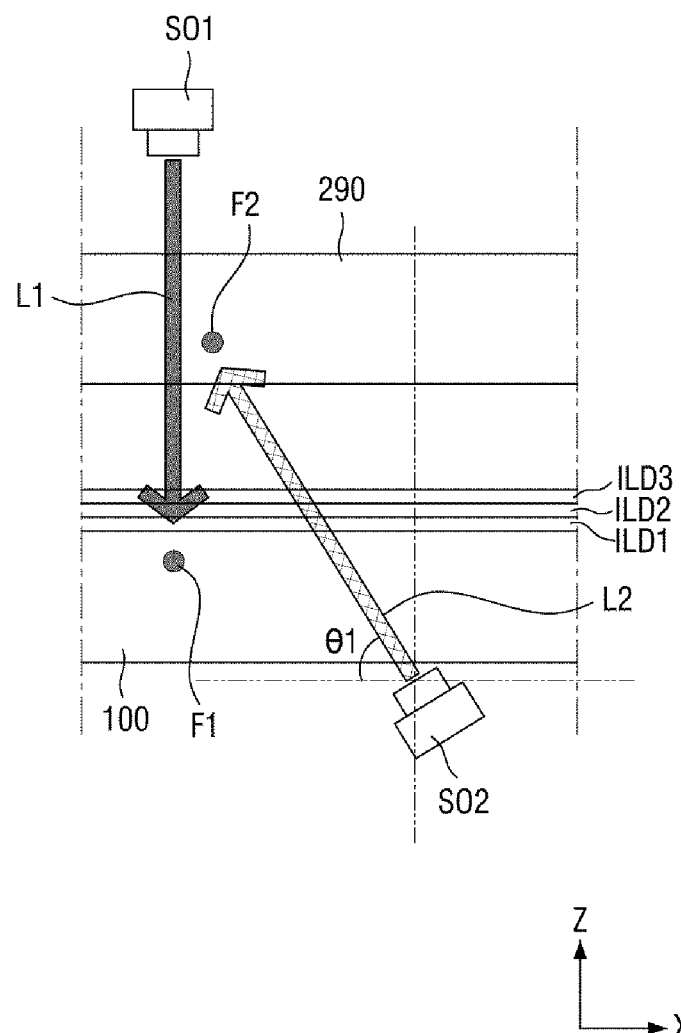
FIG. 21 is a cross-sectional view for explaining a method of manufacturing a display device according to another alternative embodiment of the invention.

FIG. 21 is a cross-sectional view for explaining a method of manufacturing a display device according to another alternative embodiment of the invention.

Referring to FIG. 21, the first sub laser L1 and/or the second sub laser L2 may be radiated at a predetermined inclination angle.

FIG. 21 illustrates a case where the second sub laser L2 is radiated at a first angle ($\theta 1$) from the Z-axis direction. In one embodiment, for example, the first angle ($\theta 1$) may be an acute angle.

The resultant product of the embodiment of FIG. 21 may be substantially the same as that of the display device described above with reference to FIG. 9.

Figure 22:
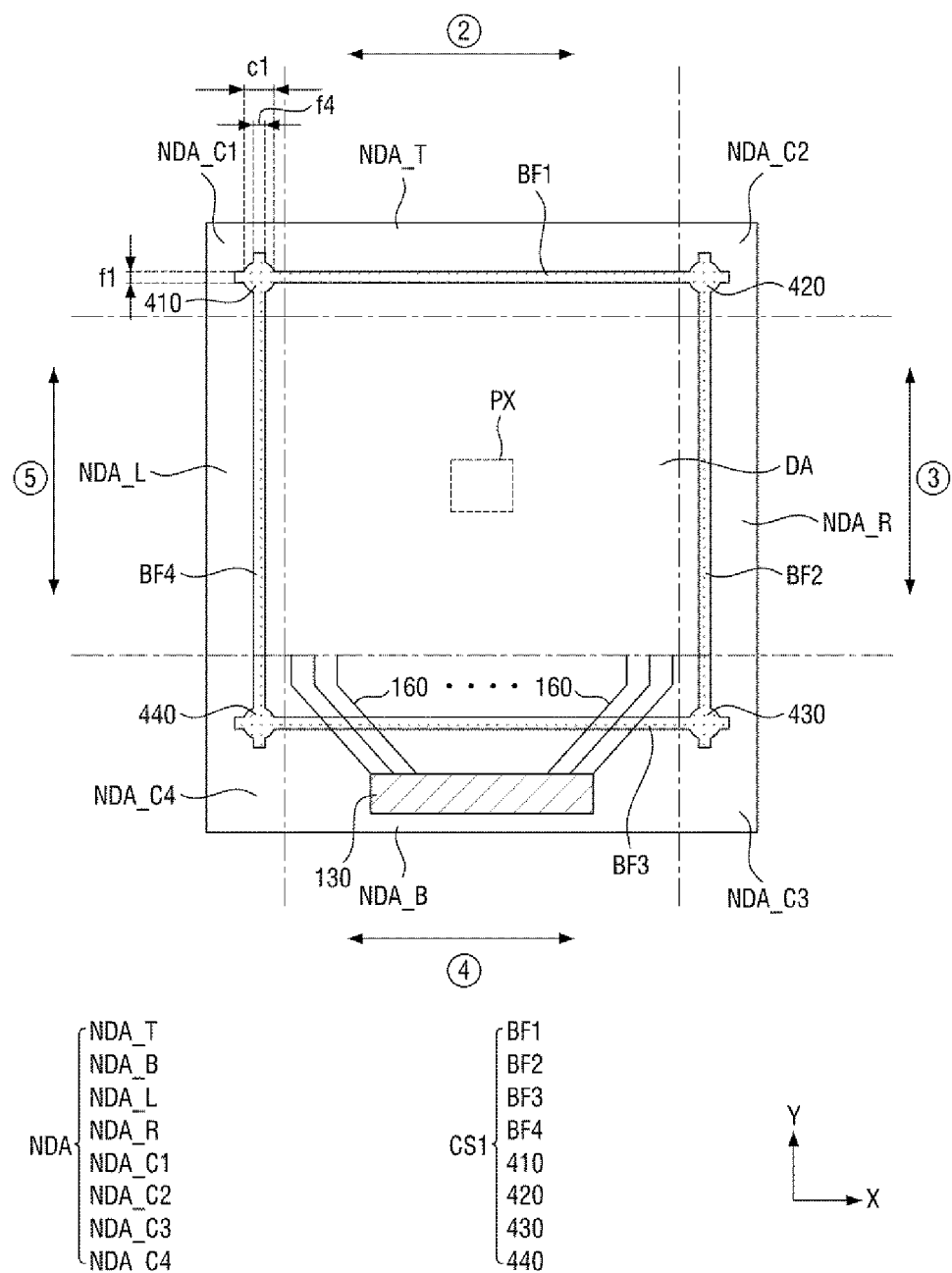
FIG. 22 is a schematic plan view for explaining a method of manufacturing a display device according to another alternative embodiment of the invention.

FIG. 22 is a schematic plan view for explaining a method of manufacturing a display device according to another alternative embodiment of the invention.

Referring to FIG. 22, in an embodiment, the process of forming the bonding filament BF connecting the first substrate 100 and the second substrate 290 by radiating a laser may include intermittently radiating the laser.

In an embodiment, the laser may be intermittently radiated.

In such an embodiment, a plurality of bonding filaments may be formed. In an embodiment, as shown in FIG. 22, the plurality of bonding filaments may include a first bonding filament BF1, a second bonding filament BF2, a third bonding filament BF3, and a fourth bonding filament BF4.

First, the first bonding filament BF1 and the third bonding filament BF3 may be formed by radiating the laser in a direction parallel to the X-axis (refer to arrows of ② and ④).

The formation of the first bonding filament BF1 and the third bonding filament BF3 may be performed simultaneously by operating two laser sources or may be performed sequentially by operating a single laser source.

Subsequently, the second bonding filament BF2 and the fourth bonding filament BF4 may be formed by radiating the laser in a direction parallel to the Y-axis (refer to arrows of ③ and ⑤).

The formation of the second bonding filament BF2 and the fourth bonding filament BF4 may be performed simultaneously by operating two laser sources or may be performed sequentially by operating a single laser source.

For convenience of description, an embodiment where the first bonding filament BF1 and the third bonding filament BF3 are formed and then the second bonding filament BF2 and the fourth bonding filament BF4 are formed as shown in FIG. 22, but an order of forming filaments is not limited thereto. In an alternative embodiment, the second bonding filament BF2 and the fourth bonding filament BF4 may be formed, and then the first bonding filament BF1 and the third bonding filament BF3 may be formed.

The path of the laser radiated in a direction parallel to the Y-axis and the path of the laser radiated in a direction parallel to the Y-axis may partially intersect each other. Thus, each of the resultant bonding filaments may intersect the adjacent boding filament. Accordingly, as shown in FIG. 11, the first intersection portion 410 to the fourth intersection portion 440 may be formed.

Figure 23:
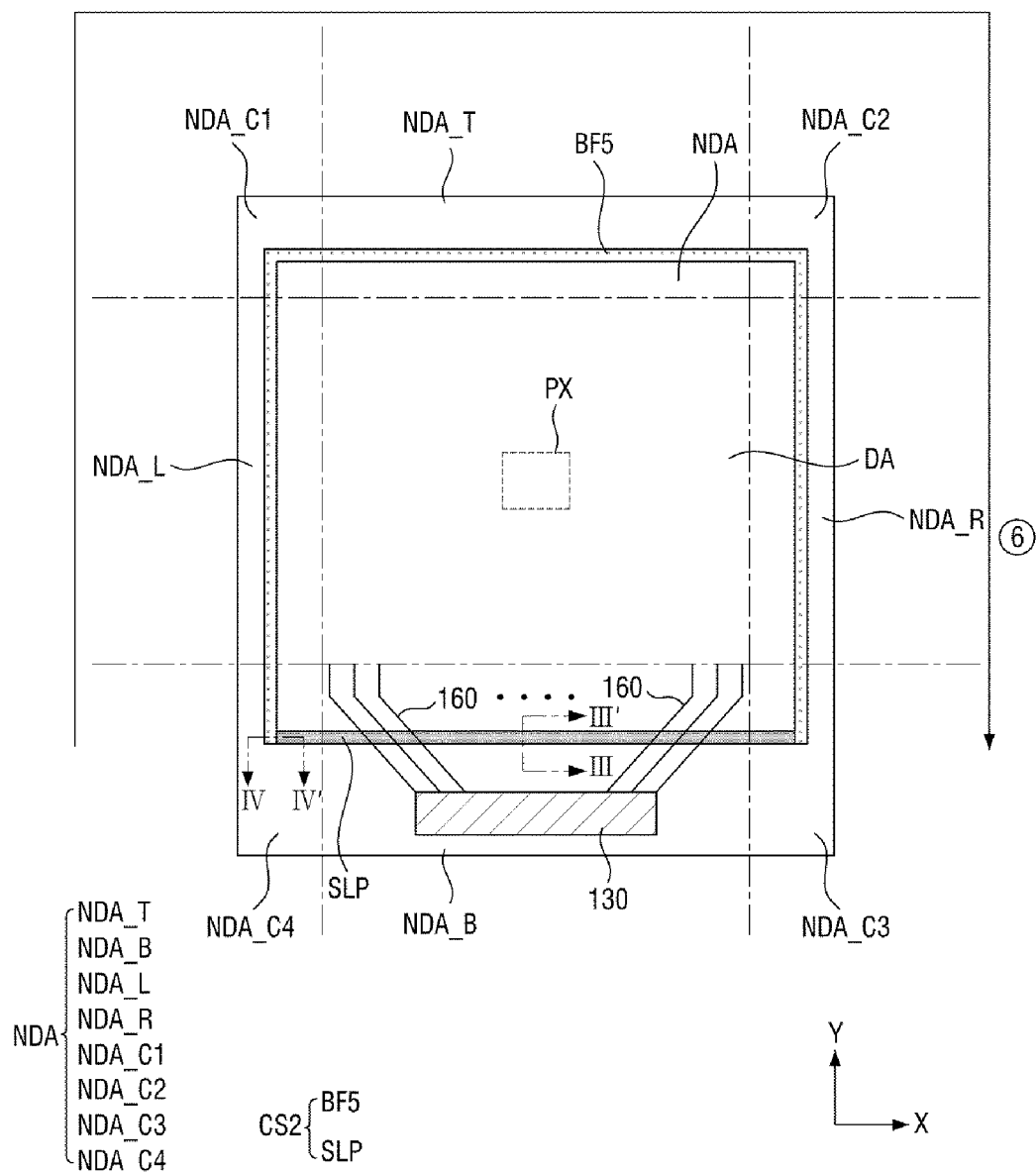
FIG. 23 is a schematic plan view for explaining a method of manufacturing a display device according to another alternative embodiment of the invention.

FIG. 23 is a schematic plan view for explaining a method of manufacturing a display device according to another alternative embodiment of the invention.

Referring to FIG. 23, in an embodiment, the step of forming the cell seal CS sealing the cell CE may include forming a frit seal SLP.

In such an embodiment, the method of manufacturing a display device may further include forming a frit in the cell CE. The process of forming the frit may be performed before the process of sealing the original panel OS including the plurality of cells CE.

The frit may be formed between the display area DA and the driving integrated circuit 130. In such an embodiment, the frit may be formed to traverse a plurality of conductive lines 160 disposed between the display area DA and the driving integrated circuit 130.

Subsequently, a process of curing the frit to form a frit seal SLP may be performed. The curing of the frit may be performed by general laser irradiation, not femtosecond laser irradiation, or may be performed by infrared irradiation.

Subsequently, a process of forming a bonding filament BF5 for connecting the first substrate 100 and the second substrate 290 by radiating a laser may be performed. The bonding filament BF may be formed by radiating the first sub laser L1, as shown in FIG. 23.

In such an embodiment, the radiation of the laser may start at one end of the frit seal SLP, as a starting point, proceed along the outer periphery of the display area DA, and stop at the other end of the frit seal SLP (refer to arrow ⑥).

Thus, the cell seal CS including the frit seal SLP and the bonding filament BF5 may have a closed polygon shape.

The shape of the cell seal CS may be the same as that in an embodiment of the display device described above.

The resultant product thereof may be substantially the same as that described above with reference FIG. 12.

In an embodiment, the process of forming the frit seal SLP and the process of forming the bonding filament BF5 may be changed in order. In such an embodiment, the bonding filament BF5 connecting both ends of the frit may be first formed, and then the frit may be cured.

As described above, according to embodiments of the invention, the area occupied by the cell seal may be reduced. Thus, a display device having a narrow bezel structure may be realized.

The effects of the invention are not limited by the foregoing, and may include other various effects are anticipated herein.

Although some exemplary embodiments of the invention have been disclosed for illustrative purposes, those skilled in the art will appreciate that various modifications, additions and substitutions are possible, without departing from the scope and spirit of the invention as disclosed in the accompanying claims.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A method of manufacturing a display device, the method comprising:
    sealing an original panel including a cell including a first substrate and a second substrate facing each other; and
    forming a cell seal to seal the cell,
    wherein the forming the cell seal comprises forming a bonding filament between the first substrate and the second substrate by radiating a laser, forming a frit in the cell, and curing the frit to form a frit seal, and
    wherein the frit seal and the bonding filament are connected to each other,
    wherein the bonding filament is in direct contact with and of a same material as the first and second substrates.

2. The method of claim 1,
    wherein the laser includes a first sub laser radiated toward the first substrate from the second substrate,
    wherein a first focal point of the first sub laser is inside the first substrate,
    wherein a focus depth of the first sub laser is in a range of about −100 micrometers to about zero micrometer, and
    wherein the focus depth of the first sub laser is measured from a surface of the first substrate which faces the second substrate.

3. The method of claim 2,
    wherein the laser further includes a second sub laser radiated toward the second substrate from the first substrate,
    wherein a second focal point of the second sub laser is inside the second substrate,
    a focus depth of the second sub laser is in a range of about zero micrometer to about 100 micrometers, and
    wherein the focus depth of the second sub laser is measured from a surface of the second substrate which faces the first substrate.

4. The method of claim 3,
    wherein at least one of the first sub laser and the second sub laser is radiated at a predetermined inclination angle inclined with respect to a thickness direction of the first substrate.

5. The method of claim 1, further comprising:
    removing an insulation film disposed on the first substrate.

6. The method of claim 1,
    wherein the forming the bonding filament between the first substrate and the second substrate by radiating the laser comprises:
    forming a first bonding filament by radiating the laser in a first direction; and
    forming a second bonding filament by radiating the laser in a second direction,
    wherein the first bonding filament and the second bonding filament intersect each other to form an intersection portion.

7. The method of claim 1, wherein the bonding filament comprises a central portion and a peripheral portion surrounding the central portion, and
    wherein a refractive index of the central portion of the bonding filament is different from a refractive index of the peripheral portion of the bonding filament.

8. The method of claim 1, wherein the bonding filament comprises an inner bonding filament and an outer bonding filament,
    wherein the inner bonding filament and the outer bonding filament partially overlap each other, and,
wherein a refractive index of an overlap area of the inner bonding filament and the outer bonding filament and a refractive index of a peripheral portion of the inner bonding filament are different from each other.

* * * * *